US012626658B2

(12) United States Patent
Du et al.

(10) Patent No.: US 12,626,658 B2
(45) Date of Patent: May 12, 2026

(54) DISPLAY SUBSTRATE AND DISPLAY PANEL FOR IMPROVING UNIFORMITY OF IMAGE QUALITY AND BRIGHTNESS

(71) Applicants: CHENGDU BOE OPTOELECTRONICS TECHNOLOGY CO., LTD., Sichuan (CN); BOE TECHNOLOGY GROUP CO., LTD., Beijing (CN); BEIJING BOE TECHNOLOGY DEVELOPMENT CO., LTD., Beijing (CN)

(72) Inventors: Mengmeng Du, Beijing (CN); Yao Huang, Beijing (CN); Jun Yan, Beijing (CN); Ansu Lee, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/861,711

(22) PCT Filed: Jan. 17, 2024

(86) PCT No.: PCT/CN2024/072840
§ 371 (c)(1),
(2) Date: Oct. 30, 2024

(87) PCT Pub. No.: WO2024/174777
PCT Pub. Date: Aug. 29, 2024

(65) Prior Publication Data
US 2025/0301856 A1 Sep. 25, 2025

(30) Foreign Application Priority Data

Feb. 24, 2023 (WO) ................ PCT/CN2023/078138
Apr. 26, 2023 (CN) ......................... 202310463215.6

(51) Int. Cl.
G09G 3/3233 (2016.01)
H10K 59/121 (2023.01)
H10K 59/131 (2023.01)

(52) U.S. Cl.
CPC ....... *G09G 3/3233* (2013.01); *H10K 59/1213* (2023.02); *H10K 59/131* (2023.02);
(Continued)

(58) Field of Classification Search
CPC ............. H10K 59/1213; H10K 59/131; G09G 3/3233; G09G 2300/0426;
(Continued)

(56) References Cited

U.S. PATENT DOCUMENTS

2011/0090200 A1    4/2011  Choi et al.
2013/0162620 A1*   6/2013  Kim ..................... G09G 3/3233
                                                              345/212
(Continued)

FOREIGN PATENT DOCUMENTS

CN        103680393 A       3/2014
CN        106205491 A       12/2016
CN        111145693 A       5/2020

OTHER PUBLICATIONS

Non-Final Office Action dated Feb. 27, 2025, issued in U.S. Appl. No. 18/289,585. (55 pages).
(Continued)

*Primary Examiner* — Stephen G Sherman
(74) *Attorney, Agent, or Firm* — WHDA, LLP

(57) ABSTRACT
The present disclosure relates to the technical field of display. Provided are a display substrate and a display panel.
(Continued)

The display substrate comprises a plurality of sub-pixels, wherein each sub-pixel comprises a pixel driving circuit and a light emitting device, which are electrically connected to each other; the pixel driving circuit comprises a driving module, a first reset module, a second reset module, an input module, a first light-emission control module, a second light-emission control module, and a compensation module; the pixel driving circuit comprises a plurality of transistors, and each transistor comprises an active portion. The display substrate further comprises a plurality of conductive patterns, wherein orthographic projections of active portions of all the transistors in at least one of the sub-pixels on a base are all located within orthographic projections of the conductive patterns on the base. The display substrate is used for preparing a display panel.

16 Claims, 9 Drawing Sheets

(52) U.S. Cl.
CPC .............. *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/0233* (2013.01); *G09G 2320/045* (2013.01)

(58) Field of Classification Search
CPC ... G09G 2300/0819; G09G 2300/0852; G09G 2300/0861; G09G 2310/08; G09G 2320/0233; G09G 2320/045
See application file for complete search history.

(56) References Cited

U.S. PATENT DOCUMENTS

| | | | |
|---|---|---|---|
| 2017/0186372 A1 | 6/2017 | Yanase et al. | |
| 2018/0122301 A1* | 5/2018 | Yoon ................... | G09G 3/3258 |
| 2018/0145123 A1 | 5/2018 | Kim et al. | |
| 2019/0079331 A1 | 3/2019 | Miyamoto et al. | |
| 2021/0150984 A1 | 5/2021 | Hwang et al. | |
| 2021/0193780 A1 | 6/2021 | Diao et al. | |
| 2022/0101777 A1 | 3/2022 | Kim et al. | |
| 2022/0102463 A1 | 3/2022 | Park et al. | |
| 2022/0114958 A1 | 4/2022 | Feng et al. | |
| 2022/0156477 A1 | 5/2022 | Lee et al. | |
| 2022/0320256 A1 | 10/2022 | Yun et al. | |
| 2022/0343842 A1 | 10/2022 | Yu | |
| 2023/0051015 A1 | 2/2023 | Im et al. | |
| 2024/0107812 A1 | 3/2024 | Kim et al. | |
| 2024/0212580 A1 | 6/2024 | Xu | |

OTHER PUBLICATIONS

Notice of Allowance dated Jul. 15, 2025, issued in U.S. Appl. No. 18/289,585.(25 pages).
Extended (Supplementary) European Search Report dated Oct. 1, 2025, issued in counterpart EP Application No. 23923403.2. (23 pages).

* cited by examiner

Active

Gate1/Gate2/Active

Active/Gate3

EM1

G3-5

G3-4

G3-6

G3-3

G3-1

Reset1

G3-7

| | Active | | Gate3 |

SD1

VDD

E2

GL

S1-4

E5

EM2

S1-6

E1

Vinit1

Reset 2

E3

S1-1

E4

O     B

A

ZD1

Vinit 2

P1     P2     P3

Active/Gate3/SD1/SD2

GD-5

GD-4

GD-6

GD-3

GD-1

GD-2

GD-7

→ VDD

→ EM1

→ GL1

→ EM2

→ Vinit 1

→ Reset 2

→ Reset 1

→ Vinit 2

DL1          DL2          DL3

ZD2    ZD3(Vinit 1)    ZD2    ZD3(Vinit 2)    ZD2    ZD3(VSS)

|←——— P1 ———→|←——— P2 ———→|←——— P3 ——→|

Active/Gate3/SD2

EM1

G3-5

G3-4

G3-6

G3-3

G3-1
Reset1

DL

ZD2
ZD3

G3-7

▨ Active    ▨ Gate3    ▨ SD2

AN

DISPLAY SUBSTRATE AND DISPLAY PANEL FOR IMPROVING UNIFORMITY OF IMAGE QUALITY AND BRIGHTNESS

CROSS-REFERENCE TO RELATED APPLICATION

The present disclosure claims the priority of Chinese patent application filed on Feb. 24, 2023 before the CNIPA, China National Intellectual Property Administration with the application number of PCT/CN2023/078138, and the title of "PIXEL DRIVING CIRCUIT AND DRIVING METHOD, DISPLAY SUBSTRATE AND DISPLAY DEVICE", and the priority of Chinese patent application filed on Apr. 26, 2023 before the CNIPA, China National Intellectual Property Administration with the application number of 202310463215.6, and the title of "DISPLAY SUBSTRATE AND DISPLAY PANEL", the entire disclosures of the aforementioned two patent applications are hereby incorporated herein by reference.

FIELD

The present disclosure relates to the field of display technologies, and more particularly to a display substrate and a display panel.

BACKGROUND

Active matrix organic light emitting diode (AMOLED) panels are more and more widely used. Pixel display devices of the AMOLED are organic light emitting diodes (OLEDs), and the AMOLED can emit light by driving a thin film transistor to generate a driving current in a saturated state, and the driving current drives a light emitting device to emit light.

SUMMARY

Embodiments of the present disclosure adopt the following technical solutions.

In a first aspect, the embodiments of the present disclosure provide a display substrate, including: a substrate and a plurality of sub-pixels arranged in an array on the substrate, wherein each of the plurality of sub-pixels includes a pixel driving circuit and a light emitting device that are electrically connected, and the pixel driving circuit includes:

a driving module electrically connected to a first node, a second node and a third node respectively, wherein the third node is electrically connected to an anode of the light emitting device, and the driving module is configured to conduct a path between the second node and the anode under a control of a voltage of the first node, and generate a current in the path for driving the light emitting device to emit light;

a first reset module and a second reset module, wherein the first reset module is electrically connected to the third node, a first reset signal line and a second initialization signal line respectively, and is configured to initialize a voltage of the anode under a control of a signal transmitted by the first reset signal line; and the second reset module is electrically connected to the first node, a fourth node, a second reset signal line and a first initialization signal line respectively, and is configured to initialize a voltage of the first node and a voltage of the fourth node under a control of a signal transmitted by the second reset signal line;

an input module electrically connected to a scanning signal line, a data signal line and a fifth node respectively, and configured to input a data signal transmitted by the data signal line to the fifth node under a control of a signal input by the scanning signal line;

a first light emitting control module and a second light emitting control module, wherein the first light emitting control module is electrically connected to a first light emitting control signal line, a positive power signal line and the second node respectively, and is configured to input a signal transmitted by the positive power signal line to the second node under a control of a signal transmitted by the first light emitting control signal line; and the second light emitting control module is electrically connected to the first node, the fifth node and a second light emitting control signal line respectively, and is configured to transmit a signal of the fifth node to the first node under a control of a signal transmitted by the second light emitting control signal line; and a compensation module electrically connected to the third node, the fourth node and the fifth node respectively, and configured to compensate a threshold voltage of the driving module, wherein the pixel driving circuit includes a plurality of transistors, and each of the plurality of transistors includes an active portion; the display substrate further includes a plurality of conductive patterns, a part of the plurality of conductive patterns are located on a side of the active portion of the transistor away from the substrate, and a part of the plurality of conductive patterns are located between the active portion of the transistor and the substrate, wherein orthographic projections of active portions of the plurality of transistors in at least one of the plurality of sub-pixels on the substrate are located within orthographic projections of the plurality of conductive patterns on the substrate.

In at least one embodiment of the present disclosure, the plurality of conductive patterns include a combination of one or more of the anode of the light emitting device, a signal line, a connection wiring, and a gate of the transistor.

In at least one embodiment of the present disclosure, the second reset module includes a first transistor and a second transistor, the driving module includes a third transistor, the input module includes a fourth transistor, the first light emitting control module includes a fifth transistor, the second light emitting control module includes a sixth transistor, the first reset module includes a seventh transistor, and the compensation module includes a first capacitor and a second capacitor;

a gate of the first transistor and a gate of the second transistor are both electrically connected to the second reset signal line, a source of the first transistor is electrically connected to the first node, a drain of the first transistor is electrically connected to the fourth node, a source of the second transistor is electrically connected to the fourth node, and a drain of the second transistor is electrically connected to the first initialization signal line;

a gate of the third transistor is electrically connected to the first node, a source of the third transistor is electrically connected to a drain of the fifth transistor through the second node, and a drain of the third transistor is electrically connected to the anode through the third node;

a gate of the fourth transistor is electrically connected to the scanning signal line, a source of the fourth transistor is electrically connected to the data signal line, and a drain of the fourth transistor is electrically connected to the fifth node;

a gate of the fifth transistor is electrically connected to the first light emitting control signal line, a source of the fifth transistor is electrically connected to the positive power signal line, a gate of the sixth transistor is electrically connected to the second light emitting control signal line, a source of the sixth transistor is electrically connected to the first node, and a drain of the sixth transistor is electrically connected to the fifth node;

a gate of the seventh transistor is electrically connected to the first reset signal line, a source of the seventh transistor is electrically connected to the third node, and a drain of the seventh transistor is electrically connected to the second initialization signal line; and a first electrode of the first capacitor is electrically connected to a first electrode of the second capacitor, a second electrode of the first capacitor is electrically connected to the third node, and a second electrode of the second capacitor is electrically connected to the fifth node.

In at least one embodiment of the present disclosure, the display substrate includes a first conductive layer, wherein the first conductive layer is located on the side of the active portion of the transistor away from the substrate; and the first conductive layer includes the positive power signal line, the scanning signal line, the second light emitting control signal line, the first initialization signal line, the second reset signal line and the second initialization signal line that are sequentially arranged in a first direction and extend in a second direction, wherein an orthographic projection of the scanning signal line on the substrate at least partially overlaps with an orthographic projection of an active portion of the fourth transistor in a same row of sub-pixels arranged in the second direction on the substrate; an orthographic projection of the second light emitting control signal line on the substrate at least partially overlaps with an orthographic projection of an active portion of the sixth transistor in the same row of sub-pixels arranged in the second direction on the substrate; an orthographic projection of the second reset signal line on the substrate at least partially overlaps with an orthographic projection of an active portion of the first transistor in the same row of sub-pixels arranged in the second direction on the substrate, and the orthographic projection of the second reset signal line on the substrate at least partially overlaps with an orthographic projection of an active portion of the second transistor in the same row of sub-pixels arranged in the second direction on the substrate, wherein the first direction intersects with the second direction.

In at least one embodiment of the present disclosure, one of the plurality of sub-pixels is located at an area defined by two adjacent data lines and two adjacent positive power signal lines, and the plurality of sub-pixels include a plurality of first sub-pixels, a plurality of second sub-pixels and a plurality of third sub-pixels that are sequentially arranged in the second direction, and one of the plurality of first sub-pixels, one of the plurality of second sub-pixels and one of the plurality of third sub-pixels that are sequentially arranged in the second direction form a pixel unit, and a plurality of pixel units are arranged in an array in the first direction and the second direction; and the plurality of conductive patterns include a first conductive pattern, a second conductive pattern and a third conductive pattern, wherein the first conductive pattern is located on the first conductive layer, and a portion of the first conductive pattern located at a position of the first sub-pixel, a portion of the first conductive pattern located at a position of the second sub-pixel and a portion of the first conductive pattern located at a position of the third sub-pixel are not completely the same.

In at least one embodiment of the present disclosure, the portion of the first conductive pattern located at the position of the third sub-pixel includes a first shielding portion, wherein an orthographic projection of the first shielding portion on the substrate at least partially overlaps with an orthographic projection of an active portion of the seventh transistor in the third sub-pixel on the substrate, and the first shielding portion is further used as a connection wiring connecting an anode of the third sub-pixel and the source of the seventh transistor.

In at least one embodiment of the present disclosure, the display substrate further includes a second conductive layer, wherein the second conductive layer is located on a side of the first conductive layer away from the substrate, and a first insulating layer is arranged between the first conductive layer and the second conductive layer; and the second conductive layer includes a plurality of data signal lines extending in the first direction, the second conductive pattern is located on the second conductive layer, the second conductive pattern includes a plurality of second shielding portions and a plurality of third shielding portions, one of the plurality of second shielding portions and one of the plurality of third shielding portions are arranged between two adjacent data signal lines, and orthographic projections of the plurality of second shielding portions on the substrate do not overlap with orthographic projections of the plurality of third shielding portions on the substrate, wherein the orthographic projections of the active portions of the first transistor, the second transistor, the fourth transistor and the sixth transistor on the substrate all at least partially overlap with the orthographic projections of the plurality of second shielding portions on the substrate, and orthographic projections of active portions of the third transistor, the fifth transistor and the seventh transistor on the substrate all at least partially overlap with the orthographic projections of the plurality of third shielding portions on the substrate.

In at least one embodiment of the present disclosure, the plurality of second shielding portions are electrically connected to the positive power signal line, and the plurality of third shielding portions are electrically connected to at least one of the first initialization signal line, the second initialization signal line or a negative power signal line.

In at least one embodiment of the present disclosure, a portion of the plurality of third shielding portions located at the position of the first sub-pixel is electrically connected to the first initialization signal line, a portion of the plurality of third shielding portions located at the position of the second sub-pixel is electrically connected to the second initialization signal line, a portion of the plurality of third shielding portions located at the position of the third sub-pixel is electrically connected to the negative power signal line, and the negative power signal line is electrically connected to a cathode of the light emitting device.

In at least one embodiment of the present disclosure, the display substrate further includes a third conductive layer, wherein the third conductive layer is located on a side of the second conductive layer away from the substrate, a second insulating layer is arranged between the second conductive layer and the third conductive layer, and the third conductive layer includes anodes of light emitting devices in all the sub-pixels, wherein in the same pixel unit, the anode of the light emitting device in the third sub-pixel covers at least the active portion of the second transistor and the active portion of the third transistor in the first sub-pixel, and further covers at least the active portion of the sixth transistor, the active portion of the first transistor, the active portion of the second transistor and the active portion of the third transistor in the second sub-pixel, and further covers at least a partial area of the active portion of the first transistor and a partial area of the active portion of the sixth transistor in the third sub-pixel; the anode of the light emitting device in the first sub-pixel covers at least the active portion of the seventh transistor in the first sub-pixel, and the anode of the light emitting device in the second sub-pixel covers at least the active portion of the seventh transistor in the second sub-pixel.

In at least one embodiment of the present disclosure, in two adjacent pixel units arranged in the first direction, the anode of the first sub-pixel in one pixel unit further covers at least a partial area of the active portion of the fourth transistor and the active portion of the fifth transistor in the first sub-pixel in the other pixel unit; and the anode of the second sub-pixel in one pixel unit further covers at least the active portion of the fifth transistor in the second sub-pixel in the other pixel unit, and a partial area of the active portion of the third sub-pixel and a partial area of the active portion of the fourth transistor.

In at least one embodiment of the present disclosure, the third conductive pattern is located on the third conductive layer, and the third conductive pattern includes a plurality of fourth shielding portions, wherein the plurality of fourth shielding portions cover at least the active portion of the third transistor in the third sub-pixel, and the plurality of fourth shielding portions and the anode of the light emitting device in the third sub-pixel are of an integrated structure.

In at least one embodiment of the present disclosure, the display substrate further includes a fourth conductive layer and a fifth conductive layer, wherein the fourth conductive layer is located between the substrate and the fifth conductive layer, and the fifth conductive layer is located between the first conductive layer and the fourth conductive layer;

the fourth conductive layer includes the first electrode of the first capacitor and the first electrode of the second capacitor, and the first electrode of the first capacitor and the first electrode of the second capacitor are of an integrated structure; and the fifth conductive layer includes a first light emitting control auxiliary line, a first reset auxiliary line, the gate of the first transistor, the gate of the second transistor, the gate of the third transistor, the gate of the fourth transistor, the gate of the fifth transistor, the gate of the sixth transistor, the gate of the seventh transistor, the second electrode of the first capacitor and the second electrode of the second capacitor, wherein the gate of the first transistor and the gate of the second transistor are of an integrated structure, the gate of the third transistor is shared with the second electrode of the first capacitor, the gate of the fifth transistor and the first light emitting control auxiliary line are of an integrated structure, the gate of the seventh transistor and the first reset auxiliary line are of an integrated structure; the first light emitting control auxiliary line is electrically connected to the first light emitting control signal line, and the first reset auxiliary line is electrically connected to the first reset signal line.

In at least one embodiment of the present disclosure, the display substrate further includes a semiconductor layer, wherein the semiconductor layer is located on a side of the fifth conductive layer away from the fourth conductive layer;

in an area where the sub-pixel is located, the semiconductor layer includes a first portion, a second portion, a third portion, a fourth portion, a fifth portion, a sixth portion and a seventh portion, wherein the first portion includes the source, the drain and the active portion of the first transistor, the second portion includes the source, the drain and the active portion of the second transistor, the third portion includes the source, the drain and the active portion of the third transistor, the fourth portion includes the source, the drain and the active portion of the fourth transistor, and the fifth portion includes the source, the drain and the active portion of the fifth transistor, the sixth portion includes the source, the drain and the active portion of the sixth transistor, and the seventh portion includes the source, the drain and the active portion of the seventh transistor, wherein the fourth portion, the sixth portion and the first portion all extend in the first direction and are sequentially connected, the second portion is located on a side of the first portion close to the third portion and is connected to the first portion, and the fifth portion, the third portion and the seventh portion all extend in the first direction and are sequentially connected; and an area of the semiconductor layer overlapping with an orthographic projection of the gate of the transistor on the substrate is the active portion of the transistor, and an area of the semiconductor layer not overlapping with an orthographic projection of the transistor on the substrate is the source or the drain of the transistor.

In at least one embodiment of the present disclosure, the display substrate further includes a sixth conductive layer, wherein the sixth conductive layer is located on a side of the semiconductor layer away from the fifth conductive layer;

the sixth conductive layer includes the first light emitting control signal line and the first reset signal line, wherein an orthographic projection of the first light emitting control signal line on the substrate overlaps with an orthographic projection of the first light emitting control auxiliary line on the substrate, and an orthographic projection of the first reset signal line on the substrate overlaps with an orthographic projection of the first reset auxiliary line on the substrate;

in the area where the sub-pixel is located, the sixth conductive layer further includes a first conductive portion, a third conductive portion, a fourth conductive portion, a fifth conductive portion, a sixth conductive portion and a seventh conductive portion, wherein the fifth conductive portion and the first light emitting control signal line are of an integrated structure, and the seventh conductive portion and the first reset signal line are of an integrated structure; and an orthographic projection of the first conductive portion on the substrate at least partially overlaps with the orthographic projection of the active portion of the first transistor on the substrate and the orthographic projection of the active portion of the second transistor on the substrate respectively, an orthographic projection of the third conductive portion on the substrate at least partially overlaps with the orthographic projection of the third transistor on the substrate, an orthographic projection of the fourth conductive portion on the substrate at least partially overlaps with the orthographic projection of the fourth transistor on the substrate, an orthographic projection of the fifth conductive portion on the substrate at least partially overlaps with the orthographic projection of the fifth transistor on the substrate, an orthographic projection of the sixth conductive portion on the substrate at least partially overlaps with the orthographic projection of the sixth transistor on the substrate, and an orthographic projection of the seventh conductive portion on the substrate at least partially overlaps with the orthographic projection of the seventh transistor on the substrate.

In at least one embodiment of the present disclosure, the transistor is a transistor with a double-gate structure, and the first conductive portion serves as another gate of the first transistor and the second transistor, the third conductive portion serves as another gate of the third transistor, the fourth conductive portion serves as another gate of the fourth transistor, the fifth conductive portion serves as another gate of the fifth transistor, the sixth conductive portion serves as another gate of the sixth transistor and the seventh conductive portion serves as another gate of the seventh transistor.

In at least one embodiment of the present disclosure, a material of the semiconductor layer includes a metal oxide.

In a second aspect, the embodiments of the present disclosure provide a display panel including the display substrate according to any one of the first aspect.

BRIEF DESCRIPTION OF THE DRAWINGS

In order to more clearly explain the technical solutions in the embodiments of the present disclosure or the related art, drawings needed in the description of the embodiments or the related art will be briefly introduced below. Obviously, the drawings described below are only some embodiments of the present disclosure. For a person skilled in the art, other drawings can be obtained according to these drawings without creative work.

DETAILED DESCRIPTION

Figure 1:
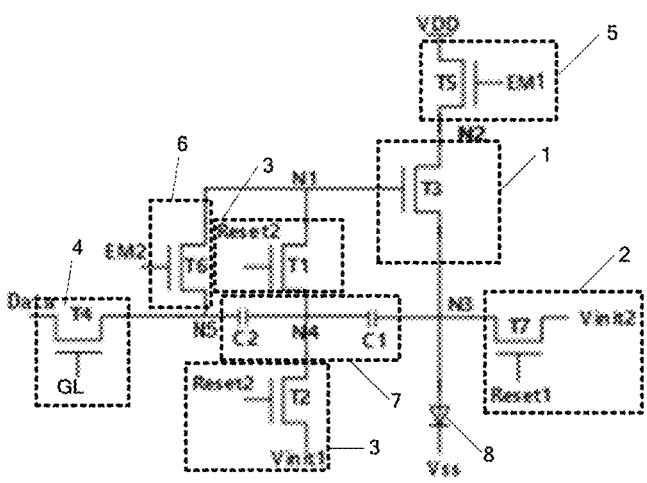
FIG. 1 is a schematic structural diagram of a pixel driving circuit provided by an embodiment of the present disclosure.

Technical solutions in embodiments of the present disclosure will be clearly and completely described below with reference to the drawings in the embodiments of the present disclosure. Obviously, the described embodiments are only a part of the embodiments of the present disclosure, but not the whole embodiments. Based on the embodiments of the present disclosure, all other embodiments obtained by a person skilled in the art without creative work belong to the protection scope of the present disclosure.

In the embodiments of the present disclosure, words "first", "second", "third" and "fourth" are used to distinguish the same or similar items with basically the same functions and effects, only to clearly describe the technical solutions of the embodiments of the present disclosure, and cannot be understood as indicating or implying relative importance or implicitly indicating the number of indicated technical features.

In the embodiments of the present disclosure, terms "up" and "down" indicate the orientation or positional relationship based on the orientation or positional relationship shown in the accompanying drawings, only for the convenience of describing the present disclosure and simplifying the description, and do not indicate or imply that the devices or elements referred to must have a specific orientation, be constructed and operated in a specific orientation, and therefore cannot be understood as limitations on the present disclosure.

In the description of the specification, terms "one embodiment", "some embodiments", "exemplary embodiments", "an example", "specific examples" or "some examples" are intended to indicate that specific features, structures, materials or characteristics related to the embodiments or examples are included in at least one embodiment or example of the present disclosure. The schematic representations of the above terms do not necessarily refer to the same embodiment or example. In addition, the described specific features, structures, materials or characteristics may be included in any one or more embodiments or examples in any appropriate manner.

In the embodiments of the present disclosure, "a plurality of" means two or more, and "at least one" means one or more, unless otherwise specifically defined.

Features "parallel", "perpendicular" and "same" used in the embodiments of the present disclosure all include the features such as "parallel", "perpendicular" and "same" in the strict sense, and the conditions such as "approximately parallel", "approximately perpendicular", "approximately the same" contain certain tolerances. Considering the measurement and the tolerance related to the measurement of a specific quantity (for example, limitations of measurement systems), the expression is within the acceptable deviation range for a specific value determined by a person skilled in the art. For example, "approximately" can mean within one or more standard deviations, or within 10% or 5% of the stated value.

Unless the context requires otherwise, throughout the specification and claims, the term "including" is interpreted as an open and inclusive meaning, that is, "including but not limited to".

"Same layer" in the embodiments of the present disclosure refers to the relationship between a plurality of film layers formed of the same material after the same step (for example, one-step patterning process). The "same layer" herein does not always mean that the thickness of the plurality of film layers is the same or the height of the plurality of film layers in cross-sectional view is the same. Polygons in this specification are not strictly defined, but can be approximate triangles, parallelograms, trapezoids, pentagon or hexagons, and the like, and there can be some small deformations caused by tolerances.

In the embodiments of the present disclosure, since a source and a drain of a transistor are symmetrical, the source and the drain of the transistor can be interchanged. In the embodiments of the present disclosure, one of the source and the drain of the transistor is referred to as the source, and the other of the source and the drain is referred to as the drain.

In the embodiments of the present disclosure, a term "electrically connected" may mean that two components are directly electrically connected, or may mean that two components are electrically connected via one or more other components.

A display substrate includes a display area and a peripheral area located around the display area. The display area includes a plurality of pixel areas (areas where sub-pixels are located), and each of the plurality of pixel areas is provided with a light emitting device and a pixel driving circuit for providing driving signals to the light emitting device.

Transistors can be divided into N-type transistors and P-type transistors. Each of the transistors in the present disclosure can be independently selected from the N-type transistors or the P-type transistors. For the N-type transistors, an operating level state is a high level state, and a non-operating level state is a low level state; and for the P-type transistors, the operating level state is the low level state, and the non-operating level state is the high level state.

In the following embodiments, all transistors in a pixel unit will be described as the N-type transistors, and the transistors in the pixel driving circuit can be fabricated at the same time using the same fabrication process.

The embodiments of the present disclosure provide a display substrate, including: a substrate and a plurality of sub-pixels arranged in an array on the substrate. Each of the plurality of sub-pixels includes a pixel driving circuit and a light emitting device that are electrically connected. As shown in FIG. 1, the pixel driving circuit includes:

a driving module 1 electrically connected to a first node N1, a second node N2 and a third node N3 respectively, where the third node N3 is electrically connected to an anode of the light emitting device 8, and the driving module 1 is configured to conduct a path between the second node N2 and the anode of the light emitting device 8 under a control of a voltage of the first node N1, and generate a current in the path for driving the light emitting device 8 to emit light;

a first reset module 2 and a second reset module 3, where the first reset module 2 is electrically connected to the third node N3, a first reset signal line (Reset1 line) and a second initialization signal line (Vinit2 line) respectively, and is configured to initialize a voltage of the anode of the light emitting device 8 under a control of a signal transmitted by the first reset signal line (Reset1 line); and the second reset module 3 is electrically connected to the first node N1, a fourth node N4, a second reset signal line (Reset2 line) and a first initialization signal line (Vinit1 line) respectively, and is configured to initialize a voltage of the first node N1 and a voltage of the fourth node N4 under a control of a signal transmitted by the second reset signal line (Reset2 line);

an input module 4 electrically connected to a scanning signal line (GL line), a data signal line (Data line) and a fifth node N5 respectively, and configured to input a data signal transmitted by the data signal line (Data line) to the fifth node N5 under a control of a signal input by the scanning signal line (GL line);

a first light emitting control module 5 and a second light emitting control module 6, where the first light emitting control module 5 is electrically connected to a first light emitting control signal line (EM1 line), a positive power signal line (VDD line) and the second node N2 respectively, and is configured to input a signal transmitted by the positive power signal line (VDD line) to the second node N2 under a control of a signal transmitted by the first light emitting control signal line (EM1 line); and the second light emitting control module 6 is electrically connected to the first node N1, the fifth node N5 and a second light emitting control signal line (EM2 line) respectively, and is configured to transmit a signal of the fifth node N5 to the first node N1 under a control of a signal transmitted by the second light emitting control signal line (EM2 line); and a compensation module 7 electrically connected to the third node N3, the fourth node N4 and the fifth node N5 respectively, and configured to compensate a threshold voltage of the driving module 1, where the pixel driving circuit includes a plurality of transistors, and each of the plurality of transistors includes an active portion; the display substrate further includes a plurality of conductive patterns, a part of the plurality of conductive patterns are located on a side of the active portion of the transistor away from the substrate, and a part of the plurality of conductive patterns are located between the active portion of the transistor and the substrate, where orthographic projections of active portions of the plurality of transistors in at least one of the plurality of sub-pixels on the substrate are located within orthographic projections of the plurality of conductive patterns on the substrate.

It should be noted that the first node N1, the second node N2, the third node N3, the fourth node N4 and the fifth node N5 in the above pixel driving circuit are connection points between two adjacent components, which are concepts put forward for the convenience of describing the connection relationship of the circuit, and are hereby described.

In at least one embodiment of the present disclosure, the plurality of conductive patterns include a combination of one or more of the anode of the light emitting device 8, a signal line, a connection wiring and a gate of the transistor.

For example, the signal line can include at least one of an initialization signal line, a reset signal line, a scanning signal line, a data signal line or a power signal line (a positive power signal line or a negative power signal line).

For example, the connection wiring is a connection line between two adjacent components.

For example, the orthographic projections of the active portions of all transistors in at least one sub-pixel on the substrate are all located within the orthographic projections of the plurality of conductive patterns on the substrate, including but not limited to the following situations.

First, the orthographic projections of the active portions of all transistors in at least one sub-pixel on the substrate are all located within an orthographic projection of the anode of the light emitting device 8 on the substrate.

Second, the orthographic projections of the active portions of all transistors in at least one sub-pixel on the substrate are all located within an orthogonal projection of a conductive pattern formed by a combination of the anode of the light emitting device 8 and the signal line on the substrate.

Third, the orthographic projections of the active portions of all transistors in at least one sub-pixel on the substrate are all located within an orthogonal projection of a conductive pattern formed by a combination of the anode of the light emitting device 8 and the connection wiring on the substrate.

Fourth, the orthographic projections of the active portions of all transistors in at least one sub-pixel on the substrate are all located within an orthogonal projection of a conductive pattern formed by a combination of the anode of the light emitting device 8 and the gate of the transistor on the substrate.

In addition, since a part of the plurality of conductive patterns are located on the side of the active portion of the transistor away from the substrate, and a part of the plurality of conductive patterns are located between the active portion of the transistor and the substrate, in some embodiments, the orthographic projections of the active portions of all transistors in at least one sub-pixel on the substrate are all located within the orthographic projections of the part of the plurality of conductive patterns arranged on the side of the active portion of the transistor away from the substrate on the substrate, and the orthographic projections of the active portions of all transistors in the sub-pixel on the substrate are all located within the orthographic projections of the part of the plurality of conductive patterns arranged between the active portion of the transistor and the substrate on the on the substrate. For example, both sides of the active portions of all transistors in at least one sub-pixel are provided with conductive patterns, and the conductive patterns on both sides of the active portions cover the active portions.

In exemplary embodiments, the above substrate can be a rigid substrate, for example, a silicon substrate, or a glass substrate. The above substrate can be a flexible substrate, for example, a flexible polyimide or other flexible polymer films.

Here, there is no limitation on the display color of each sub-pixel mentioned above.

In some embodiments, the display color of each sub-pixel may be the same, for example, all sub-pixels display blue; and for another example, all sub-pixels display white.

In other embodiments, the display substrate can include a plurality of sub-pixels displaying different colors. For example, the display substrate can include three sub-pixels displaying red, blue and green at the same time; and for another example, the display substrate can include four sub-pixels displaying red, blue, green and white at the same time.

Here, there is no limitation on the type of the light emitting device 8 mentioned above.

For example, the above light emitting device 8 can be a light emitting diode, or the like. The light emitting diode can be an organic light emitting diode (OLED), a QD light emitting diode (QLED), a micro light emitting diode (Micro-LED), and the like. The embodiments of the present disclosure take the light emitting device as an OLED light emitting device as an example.

In at least one embodiment of the present disclosure, as shown in FIG. 1, the second reset module 3 includes a first transistor T1 and a second transistor T2, the driving module 1 includes a third transistor T3, the input module 4 includes a fourth transistor T4, the first light emitting control module 5 includes a fifth transistor T5, the second light emitting control module 6 includes a sixth transistor T6, the first reset module 2 includes a seventh transistor T7, and the compensation module 7 includes a first capacitor C1 and a second capacitor C2.

A gate of the first transistor T1 and a gate of the second transistor T2 are both electrically connected to the second reset signal line (Reset2 line), a source of the first transistor T1 is electrically connected to the first node N1, a drain of the first transistor T1 is electrically connected to the fourth node N4, a source of the second transistor T2 is electrically connected to the fourth node N4, and a drain of the second transistor T2 is electrically connected to the first initialization signal line (Vinit1 line).

A gate of the third transistor T3 is electrically connected to the first node N1, a source of the third transistor T3 is electrically connected to a drain of the fifth transistor T5 through the second node N2, and a drain of the third transistor T3 is electrically connected to the anode of the light emitting device 8 through the third node N3.

A gate of the fourth transistor T4 is electrically connected to the scanning signal line (GL line), a source of the fourth transistor T4 is electrically connected to the data signal line (DL line), and a drain of the fourth transistor T4 is electrically connected to the fifth node N5.

A gate of the fifth transistor T5 is electrically connected to the first light emitting control signal line (EM1 line), a source of the fifth transistor T5 is electrically connected to the positive power signal line (VDD line), a gate of the sixth transistor T6 is electrically connected to the second light emitting control signal line (EM2 line), a source of the sixth transistor T6 is electrically connected to the first node N1, and a drain of the sixth transistor T6 is electrically connected to the fifth node N5.

A gate of the seventh transistor T7 is electrically connected to the first reset signal line (Reset 1 line), a source of the seventh transistor T7 is electrically connected to the third node N3, and a drain of the seventh transistor T7 is electrically connected to the second initialization signal line (Vinit2 line).

A first electrode of the first capacitor C1 is electrically connected to a first electrode of the second capacitor C2, a second electrode of the first capacitor C1 is electrically connected to the third node N3, and a second electrode of the second capacitor C2 is electrically connected to the fifth node N5.

Taking each transistor in the pixel driving circuit as an example, the operating principle of the pixel driving circuit will be explained in combination with a timing diagram of the pixel driving circuit in FIG. 2.

Figure 2:
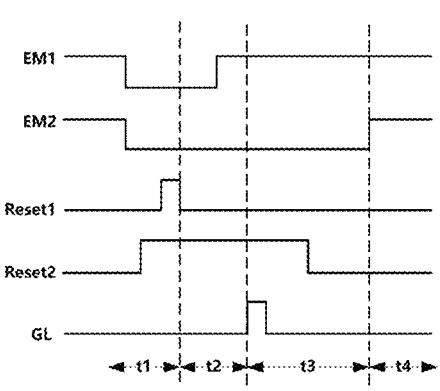
FIG. 2 is a timing diagram of FIG. 1.
Figure 3:
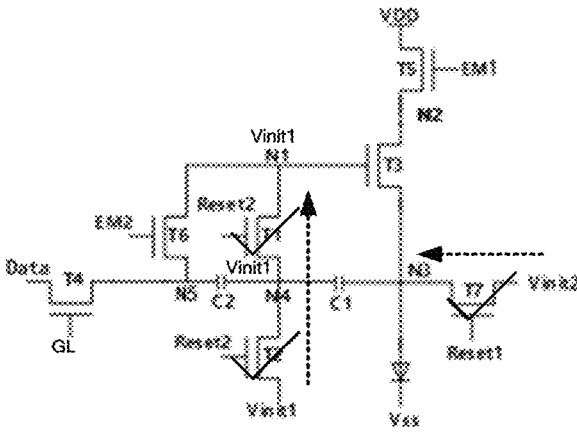
FIG. 3 to FIG. 6 are explanatory diagrams of an operating principle of the pixel driving circuit in FIG. 1.

In a reset stage t1, as shown in FIG. 2 and FIG. 3, a first light emitting control signal provided by the first light emitting control signal line (EM1 line), a second light emitting control signal provided by the second light emitting control line (EM2 line) and a scanning signal provided by the scanning signal line (GL line) are all in the non-operating level state, so that the fifth transistor T5, the sixth transistor T6 and the fourth transistor T4 are all turned off. A second reset signal provided by the second reset signal line (Reset2 line) reaches the operating level state, so that the second transistor T2 and the first transistor T1 are turned on. A first initialization voltage signal provided by the first initialization signal line (Vinit1 line) is transmitted to the first node N1 and the fourth node N4, and potentials of the first node N1 and the fourth node N4 both reach Vinit1. Then, a first reset signal provided by the first reset signal line (Reset1 line) reaches the operating level state, so that the seventh transistor T7 is turned on, and a second initialization voltage signal on the second initialization signal line (Vinit2 line) is transmitted to the third node N3.

Figure 4:
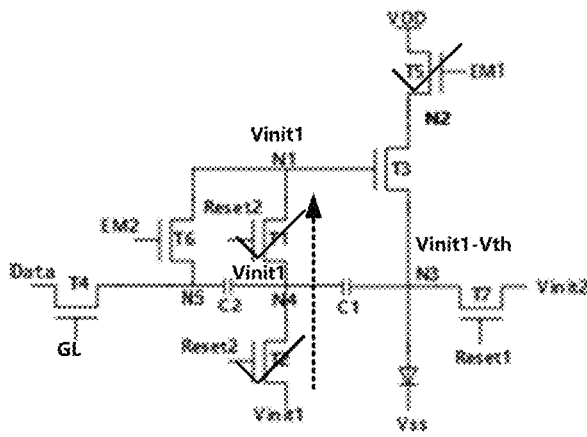

In a threshold compensation stage t2, as shown in FIG. 2 and FIG. 4, the second light emitting control signal provided by the second light emitting control line (EM2 line), the first reset signal provided by the first reset signal line (Reset1 line) and the scanning signal provided by the scanning signal line (GL line) are all in the non-operating level state, at this time, the sixth transistor T6, the seventh transistor T7 and the fourth transistor T4 are all turned off. In addition, the first light emitting control signal provided by the first light emitting control signal line (EM1 line) and the second reset signal provided by the second reset signal line (Reset2 line) reach the operating level state, so that the fifth transistor T5, the second transistor T2 and the first transistor T1 are all turned on. The first initialization voltage signal provided by the first initialization signal line (Vinit1 line) is transmitted to the first node N1, since a gate-source voltage of the driving transistor T3 is greater than a threshold voltage, the driving transistor T3 is turned on, and when the third node N3 is continuously charged to Vinit1−Vth, the driving transistor T3 is turned off. At this time, the potential of the third node N3 is Vinit1−Vth, where Vinit1 is a voltage of the first initialization signal, and Vth is the threshold voltage of the driving transistor T3.

Figure 5:
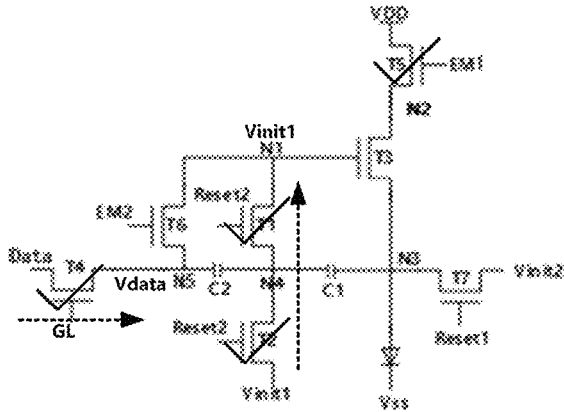

In a data writing stage t3, as shown in FIG. 2 and FIG. 5, the scanning signal provided by the scanning signal line (GL line) reaches the operating level state, so that the fourth transistor T4 is turned on, the data signal on the data signal line (DL line) is transmitted to the fifth node N5, and the potential of the fifth node N5 is recorded as Vdata. In addition, the first light emitting control signal provided by the first light emitting control signal line (EM1 line) and the second reset signal on the second reset signal line (Reset2 line) are in the operating level state, so that the fifth transistor T5, the second transistor T2 and the third transistor T1 are turned on. The potential of the fourth node N4 remains at Vinit1, since the fourth node N4 receives a signal with a fixed potential, the second capacitor C2 will not bootstrap, thereby ensuring that the fourth node N4 and the third node N3 will not be affected by the data signal. At the same time, the second light emitting control signal provided by the second light emitting control line (EM2 line) is in the non-operating level state, so that the sixth transistor T6 is turned off to prevent a voltage of the fifth node N5 from affecting the first node N1 and the fourth node N4.

Figure 6:
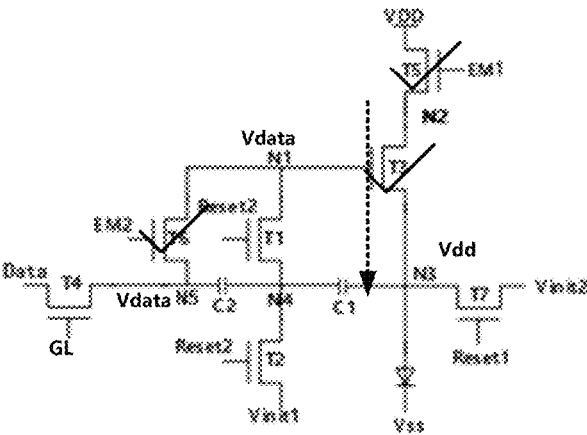

In a light emitting stage t4, as shown in FIG. 2 and FIG. 6, the first reset signal provided by the first reset signal line (Reset1 line), the second reset signal provided by the second reset signal line (Reset2 line) and the scanning signal provided by the scanning signal line (GL line) are all in the non-operating level state, so that the seventh transistor T7, the second transistor T2, the first transistor T1 and the fourth transistor T4 are all turned off. The first light emitting control signal provided by the first light emitting control signal line (EM1 line) and the second light emitting control signal provided by the second light emitting control line (EM2 line) are both in the operating level state, at this time, the fifth transistor T5 and the sixth transistor T6 are both turned on, and the potential of the third node N3 changes to Vdd. Under the bootstrap of the first capacitor C1 and the second capacitor C2, the potentials of the fourth node N4 and the fifth node N5 change correspondingly, and the potential of the fifth node N5 changes to Vdata+Vdd−Vinit1+Vth, so that the potential of the first node N1 reaches Vdata+Vdd−Vinit1+Vth. The light emitting device 2 emits light under the driving of the driving transistor T3, at this time, the driving transistor T3 operates in a saturation region, the gate-source voltage Vgs of the driving transistor T3 is (Vdata+Vdd−Vinit1+Vth)−Vdd=Vdata−Vinit1+Vth.

An expression of a driving current of the driving transistor T3 is as follows:

$$IOLED =$$

$$\beta(Vgs - Vth)^2 = (Vdata - Vinit1 + Vth - Vth)^2 = (Vdata - Vinit1)^2,$$

where $\beta = \frac{1}{2}\mu_n C_{ox}(W/L)$, $\mu_n$ is electron mobility, $C_{ox}$ is insulation capacitance per unit area, and W/L is the width-length ratio of the driving transistor T3.

With the size of the OLED screen increases (2048 rows→3296 rows) and the display mode of the OLED screen changes (a long landscape mode→a portrait mode), various changes result in a decrease in a charging time from 3.6 us to 1.9 us per operating cycle (1H). The pixel driving circuit operates in four stages: reset, sampling (Vth compensation), Data signal writing and light emitting. For the traditional pixel circuit, the sampling is carried out synchronously with the data signal (Data) writing, and a sampling time is relatively short sampling time, which leads to insufficient sampling time at high frequency and high resolution, thereby affecting the image quality to some extent. Based on this, a separate circuit is extended to separate the sampling Vth compensation from the Data signal writing, and thus the sampling time and compensation time can be extended. The longer the Vth compensation time, the better the image quality.

In addition, in the embodiments of the present disclosure, by arranging the orthographic projections of the active portions of all transistors in at least one sub-pixel on the substrate to be within the orthographic projections of the plurality of conductive patterns on the substrate, the influence of illumination on the active portions can be avoided, and the generation of photocarriers can be avoided, and thus the problem of TFT characteristic drift caused by illumination of the active portions of the transistors can be well avoided, thereby improving the image quality of the product, and improving the yield.

Hereinafter, taking the pixel driving circuit in FIG. 5 as an example, a layout of the pixel driving circuit will be introduced.

Figure 7:
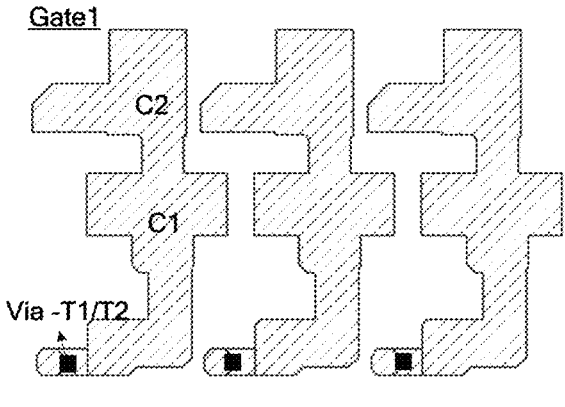
FIG. 7 is a schematic plan view of a fourth conductive layer in a display substrate provided by an embodiment of the present disclosure.
Figure 8:
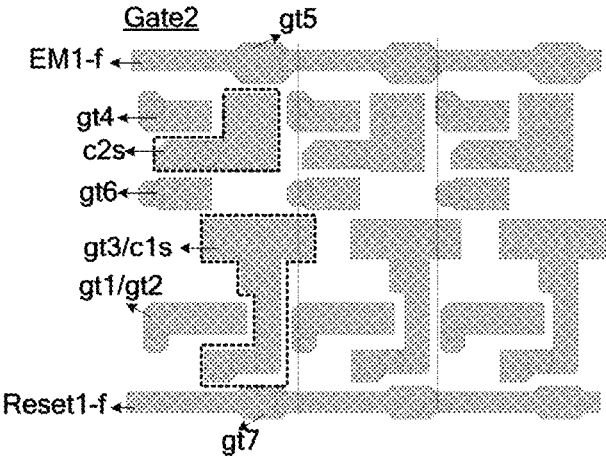
FIG. 8 is a schematic plan view of a fifth conductive layer in a display substrate provided by an embodiment of the present disclosure.
Figure 9:
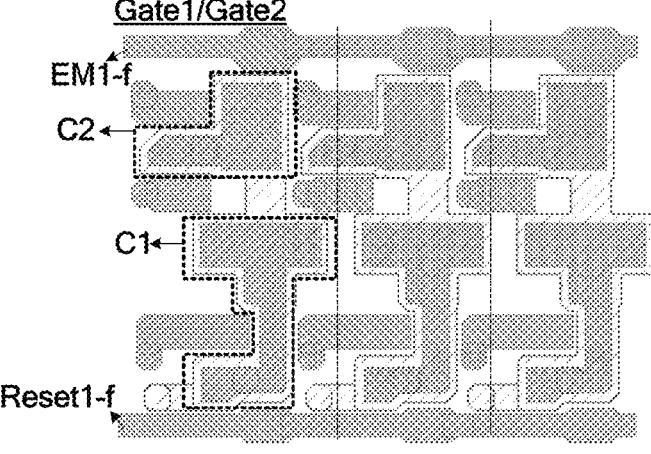
FIG. 9 is a schematic plan view of a fourth conductive layer and a fifth conductive layer as stacked in a display substrate provided by an embodiment of the present disclosure.
Figure 10:
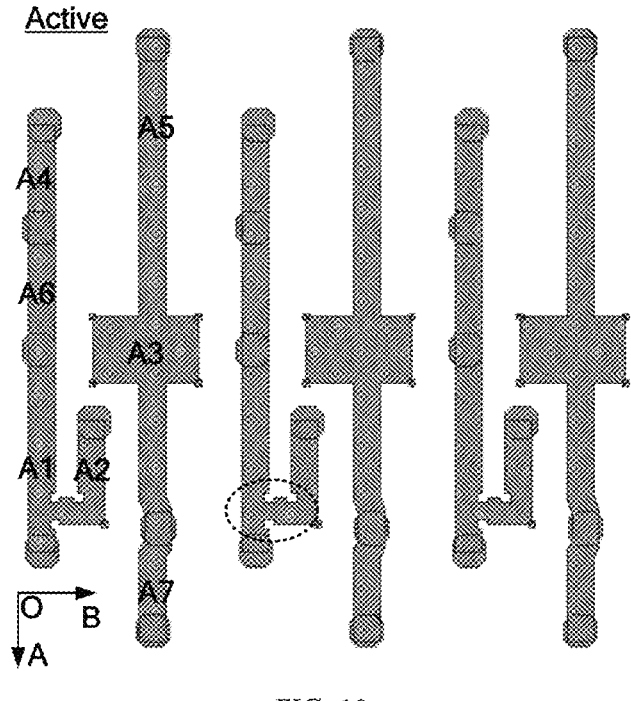
FIG. 10 is a schematic plan view of a semiconductor layer in a display substrate provided by an embodiment of the present disclosure.
Figure 11:
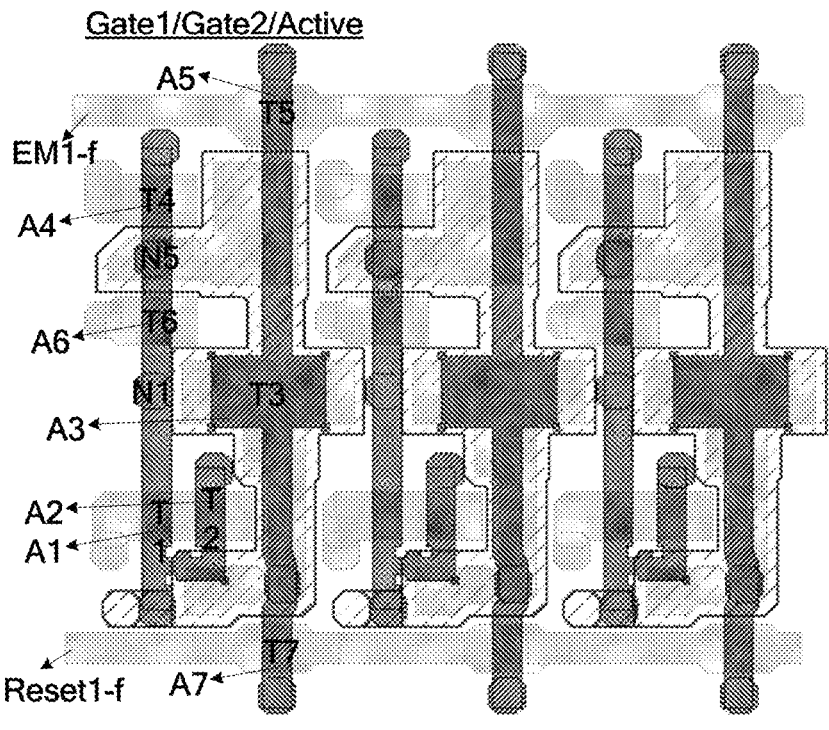
FIG. 11 is a schematic plan view of a fourth conductive layer, a fifth conductive layer and a semiconductor layer as stacked in a display substrate provided by an embodiment of the present disclosure.
Figure 12:
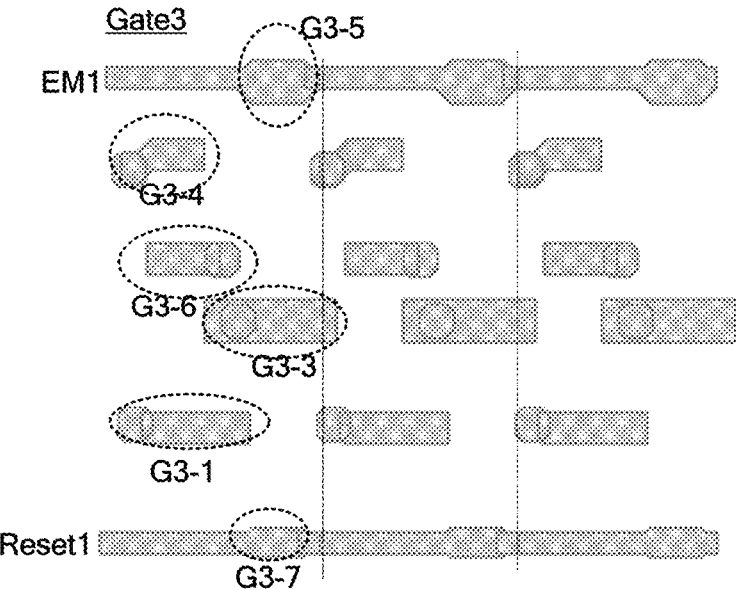
FIG. 12 is a schematic plan view of a sixth conductive layer in a display substrate provided by an embodiment of the present disclosure.
Figure 13:
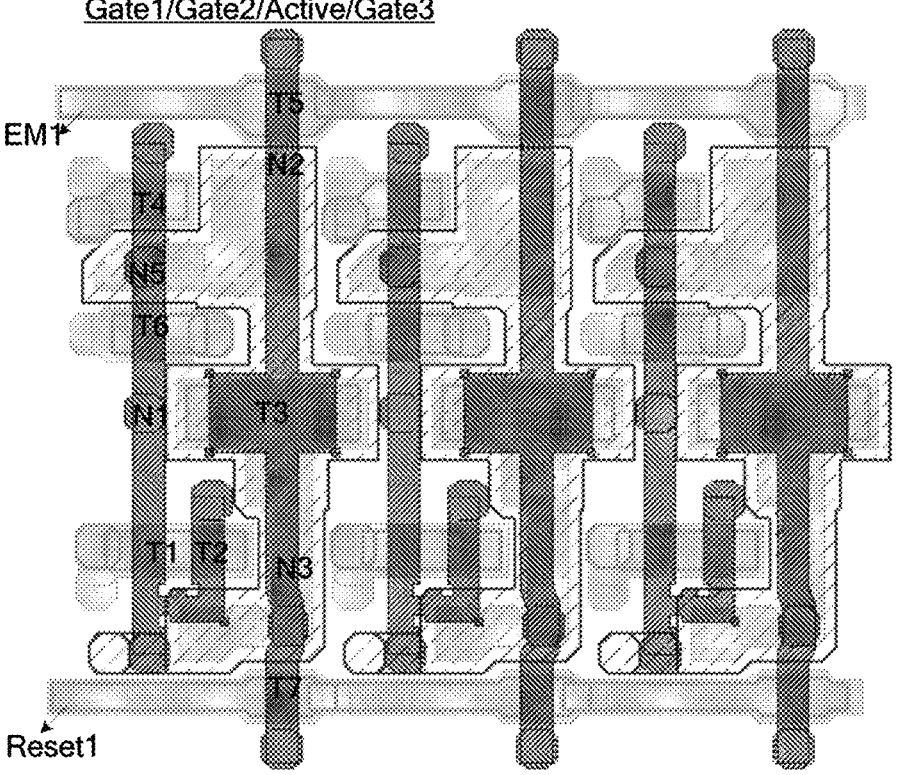
FIG. 13 is a schematic plan view of a fourth conductive layer, a fifth conductive layer, a semiconductor layer and a sixth conductive layer as stacked in a display substrate provided by an embodiment of the present disclosure.
Figure 14:
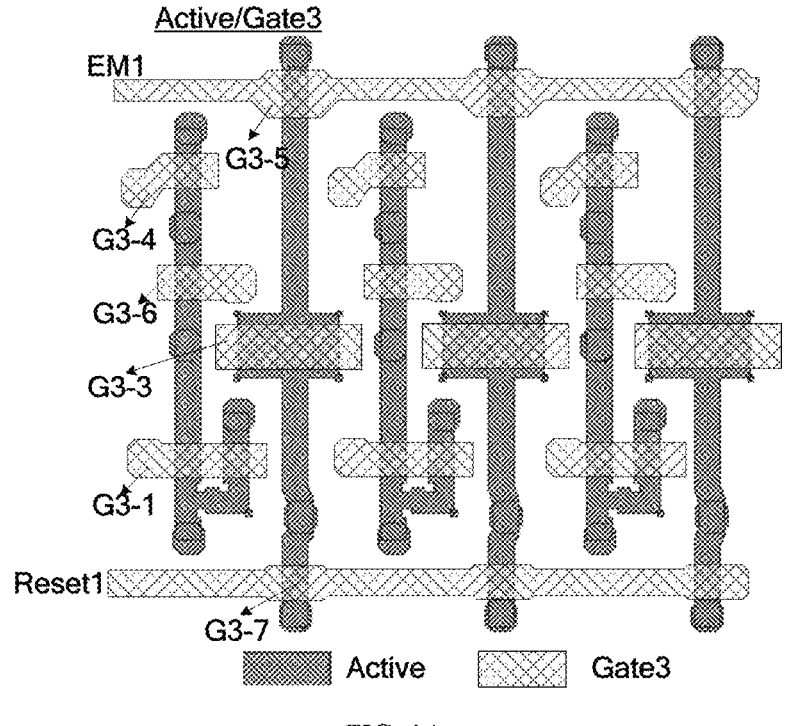
FIG. 14 is a schematic plan view of a semiconductor layer and a sixth conductive layer as stacked in a display substrate provided by an embodiment of the present disclosure.

FIG. 7 is a schematic plan view of a fourth conductive layer (also called Gate1 layer) in a display substrate provided by an embodiment of the present disclosure. FIG. 8 is a schematic plan view of a fifth conductive layer (also called Gate2 layer) in a display substrate provided by an embodiment of the present disclosure. FIG. 9 is a schematic plan view of a fourth conductive layer and a fifth conductive layer as stacked (Gate1 layer/Gate2 layer) in a display substrate provided by an embodiment of the present disclosure. FIG. 10 is a schematic plan view of a semiconductor layer (also called Active layer) in a display substrate provided by an embodiment of the present disclosure. FIG. 11 is a schematic plan view of a fourth conductive layer, a fifth conductive layer and a semiconductor layer as stacked (Gate1 layer/Gate2 layer/Active layer) in a display substrate provided by an embodiment of the present disclosure. FIG. 12 is a schematic plan view of a sixth conductive layer (also called Gate3 layer) in a display substrate provided by an embodiment of the present disclosure. FIG. 13 is a schematic plan view of a fourth conductive layer, a fifth conductive layer, a semiconductor layer and a sixth conductive layer as stacked (Gate1 layer/Gate2 layer/Active layer/Gate3 layer) in a display substrate provided by an embodiment of the present disclosure. FIG. 14 is a schematic plan view of a semiconductor layer and a sixth conductive layer as stacked (Active layer/Gate3 layer) in a display substrate provided by an embodiment of the present disclosure.

Figure 15:
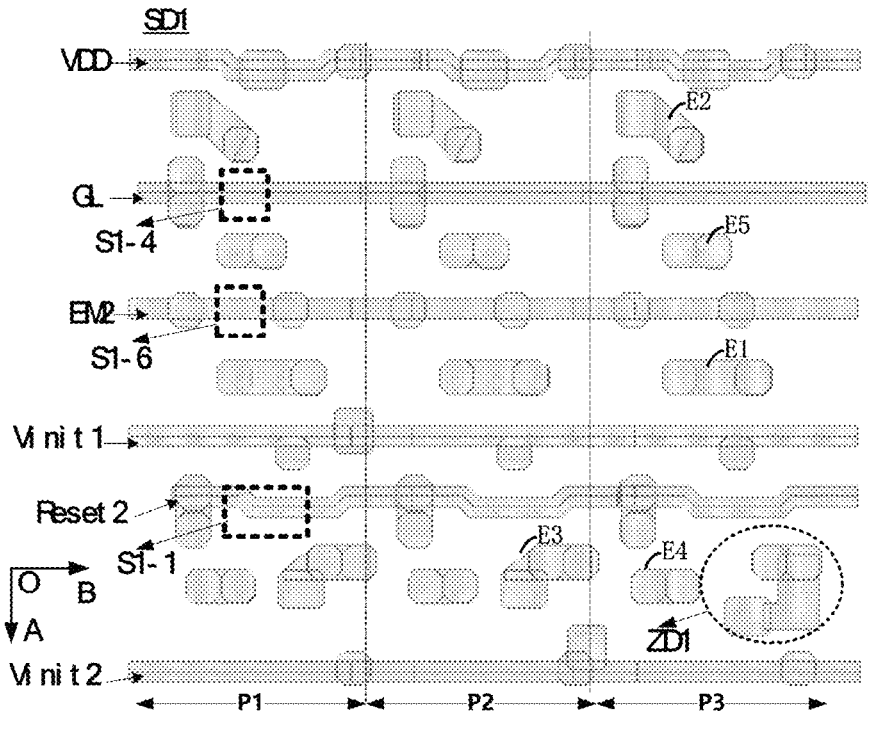
FIG. 15 is a schematic plan view of a first conductive layer in a display substrate provided by an embodiment of the present disclosure.
Figure 16:
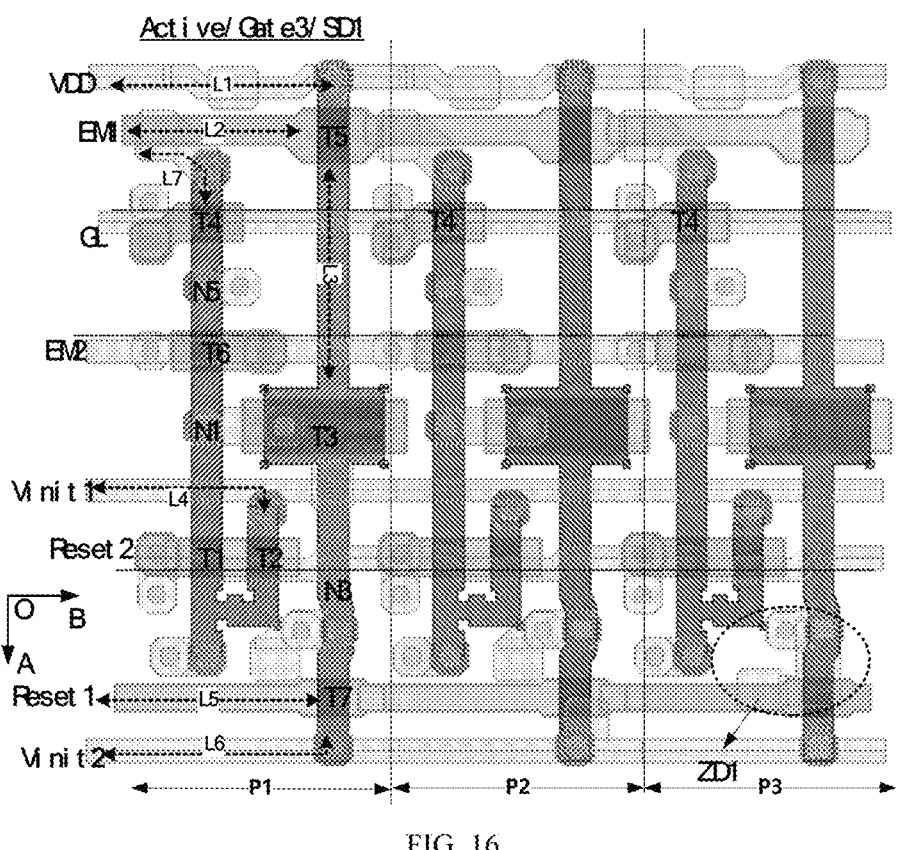
FIG. 16 is a schematic plan view of a semiconductor layer, a sixth conductive layer and a first conductive layer as stacked in a display substrate provided by an embodiment of the present disclosure.

FIG. 15 is a schematic plan view of a first conductive layer (SD1 layer) in a display substrate provided by an embodiment of the present disclosure. FIG. 16 is a schematic plan view of a semiconductor layer, a sixth conductive layer and a first conductive layer as stacked (Active layer/Gate3 layer/SD1 layer) in a display substrate provided by an embodiment of the present disclosure.

Figure 17:
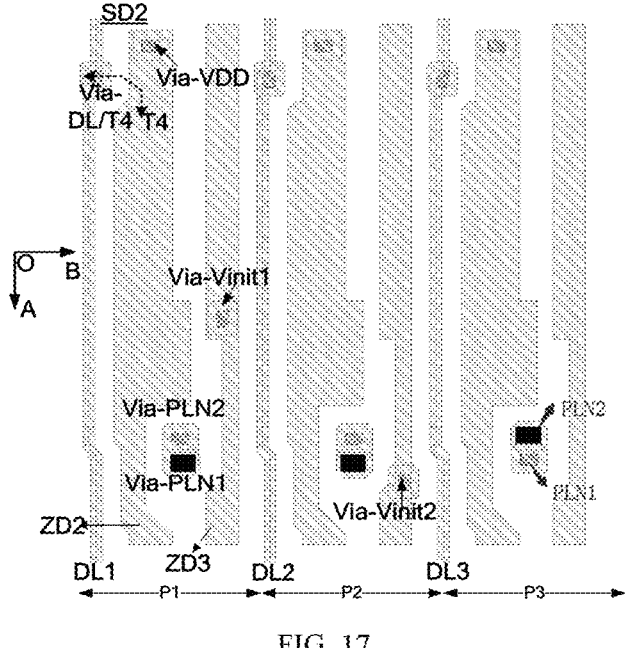
FIG. 17 is a schematic plan view of a second conductive layer in a display substrate provided by an embodiment of the present disclosure.
Figures 18, 19:
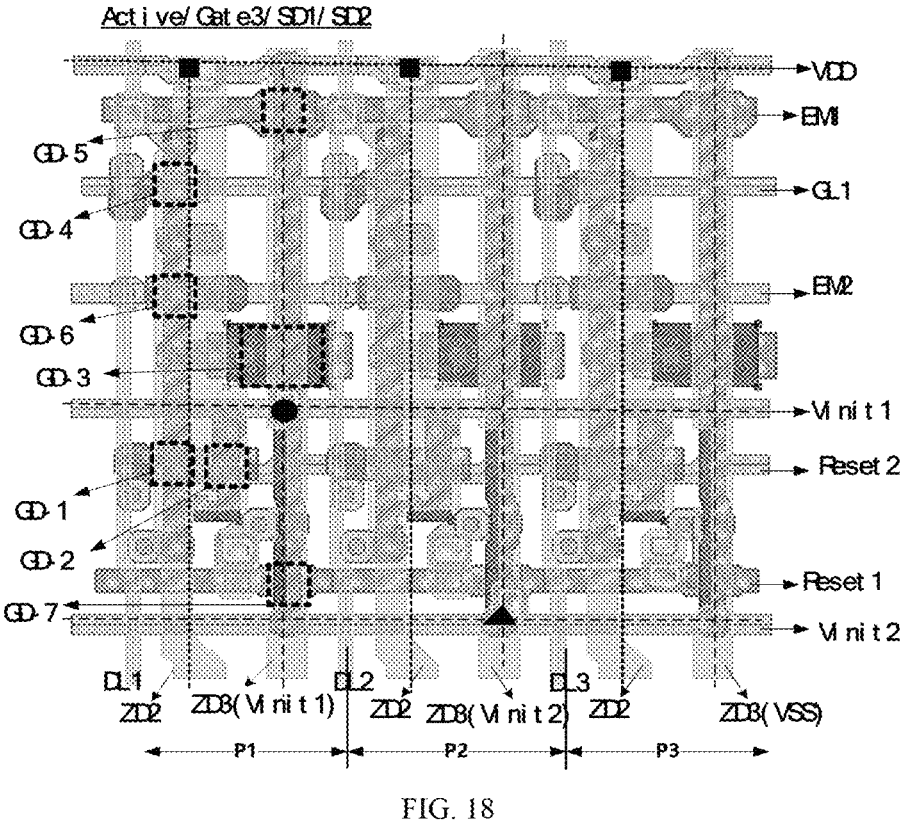
FIG. 18 is a schematic plan view of a semiconductor layer, a sixth conductive layer, a first conductive layer and a second conductive layer as stacked in a display substrate provided by an embodiment of the present disclosure.
FIG. 19 is a schematic plan view of a semiconductor layer, a sixth conductive layer and a second conductive layer as stacked in a display substrate provided by an embodiment of the present disclosure.

FIG. 17 is a schematic plan view of a second conductive layer (SD2 layer) in a display substrate provided by an embodiment of the present disclosure. FIG. 18 is a schematic plan view of a semiconductor layer, a sixth conductive layer, a first conductive layer and a second conductive layer as stacked (Active layer/Gate3 layer/SD1 layer/SD2 layer) in a display substrate provided by an embodiment of the present disclosure. FIG. 19 is a schematic plan view of a semiconductor layer, a sixth conductive layer and a second conductive layer as stacked (Active layer/Gate3 layer/SD2 layer) in a display substrate provided by an embodiment of the present disclosure.

Figure 20:
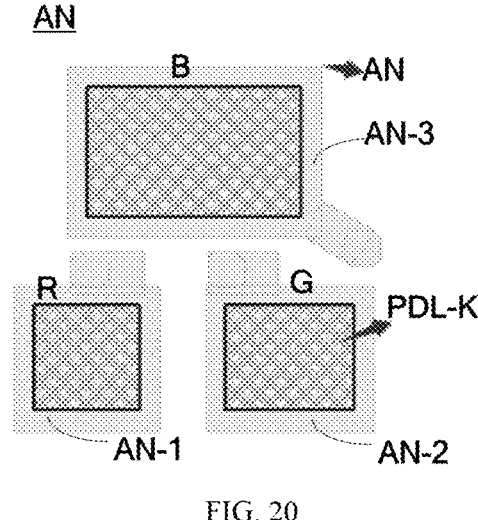
FIG. 20 is a schematic plan view of a third conductive layer in a display substrate provided by an embodiment of the present disclosure.
Figure 21:
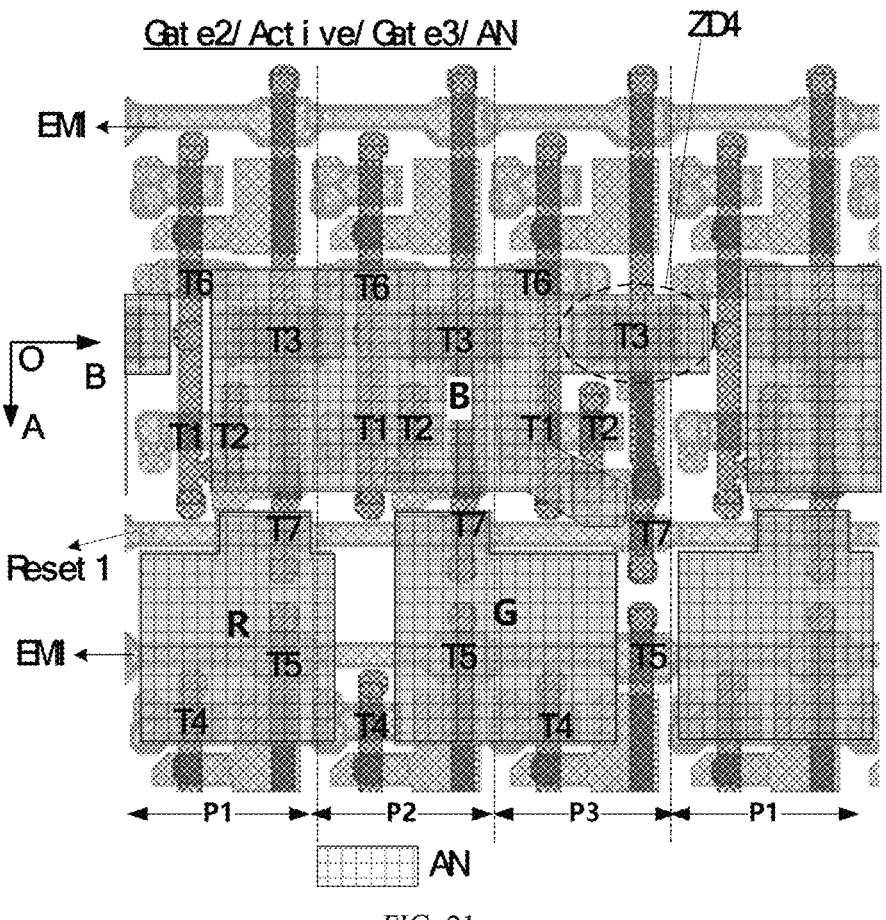
FIG. 21 is a schematic plan view of a fifth conductive layer, a semiconductor layer, a sixth conductive layer and a third conductive layer as stacked in a display substrate provided by an embodiment of the present disclosure.

FIG. 20 is a schematic plan view of a third conductive layer (AN layer) in a display substrate provided by an embodiment of the present disclosure. FIG. 21 is a schematic plan view of a fifth conductive layer, a semiconductor layer, a sixth conductive layer and a third conductive layer as stacked (Gate2 layer/Active layer/Gate3 layer/AN layer) in a display substrate provided by an embodiment of the present disclosure.

In at least one embodiment of the present disclosure, as shown in FIG. 15, the display substrate includes a first conductive layer (for example, SD1 layer). The first conductive layer is located on the side of the active portion of the transistor away from the substrate.

The first conductive layer (for example, SD1 layer) includes the positive power signal line (VDD line), the scanning signal line (GL line), the second light emitting control signal line (EM2 line), the first initialization signal line (Vinit1 line), the second reset signal line (Reset2 line) and the second initialization signal line (Vinit2 line) that are sequentially arranged in a first direction OA and extend in a second direction OB.

For example, the first conductive layer (for example, SD1 layer) can include, for example, metals, metal alloys, metal nitrides, conductive metal oxides, and the like. For example, the first conductive layer (for example, SD1 layer) can include gold (Au), an alloy of gold, silver (Ag), an alloy of silver, aluminum (Al), an alloy of aluminum, aluminum nitride (AlNx), tungsten (W), tungsten nitride (WNx), copper (Cu), an alloy of copper, nickel (Ni), chromium (Cr), chromium nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), tin oxide (SnOx), indium oxide (InOx), gallium oxide (GaOx), indium tin oxide (ITO), indium zinc oxide (IZO), and the like. The first conductive layer (for example, SD1 layer) can have a single layer or a plurality of layers.

For example, materials of the second conductive layer (SD2 layer), the third conductive layer (AN layer), the fourth conductive layer (Gate1), the fifth conductive layer (Gate2) and the sixth conductive layer (Gate3) can refer to the above description of the material of the first conductive layer.

For example, the materials of the first conductive layer (for example, SD1 layer), the second conductive layer (SD2 layer), the third conductive layer (AN layer), the fourth conductive layer (Gate1), the fifth conductive layer (Gate2) and the sixth conductive layer (Gate3) can all be opaque conductive materials, for example, metals. In the embodiments of the present disclosure, taking the materials of the above conductive layers as metal as an example for explanation.

An insulating layer can be arranged between two adjacent conductive layers, and the specific arrangement method of the insulating layer can refer to the introduction in the related art, which will not be repeated here.

As shown in FIG. 15 and FIG. 16, for example, in an area marked S1-4 in FIG. 15, an orthographic projection of the scanning signal line (GL line) on the substrate at least partially overlaps with an orthographic projection of an active portion of the fourth transistor T4 in a same row of sub-pixels arranged in the second direction OB on the substrate.

For example, in an area marked S1-6 in FIG. 15, an orthographic projection of the second light emitting control signal line (EM2 line) on the substrate at least partially overlaps with an orthographic projection of an active portion of the sixth transistor T6 in the same row of sub-pixels arranged in the second direction OB on the substrate.

For example, in an area marked S1-1 in FIG. 15, an orthographic projection of the second reset signal line (Reset2 line) on the substrate at least partially overlaps with an orthographic projection of an active portion of the first transistor T1 in the same row of sub-pixels arranged in the second direction OB on the substrate, and the orthographic projection of the second reset signal line (Reset2 line) on the substrate at least partially overlaps with an orthographic projection of an active portion of the second transistor T2 in the same row of sub-pixels arranged in the second direction OB on the substrate.

The first direction OA direction intersects with the second direction OB.

For example, the first direction OA can be a direction along a row, and the second direction OB can be a direction along a column. It should be noted that the signal line "extending in the first direction" (or "extending in the second direction") mentioned in the embodiments of the present disclosure does not necessarily mean that the signal line must be straight, and can also have a certain degree of bending, as long as the signal line as a whole is in the first direction (or the second direction).

In this specification, "at least partially overlap" includes cases of partial overlap and full overlap.

In at least one embodiment of the present disclosure, one of the plurality of sub-pixels is located at an area defined by two adjacent data lines (DL line) and two adjacent positive power signal lines (VDD line). The plurality of sub-pixels include a plurality of first sub-pixels P1, a plurality of second sub-pixels P2 and a plurality of third sub-pixels P3 that are sequentially arranged in the second direction OB. One of the plurality of first sub-pixels P1, one of the plurality of second sub-pixels P2 and one of the plurality of third sub-pixels P3 that are sequentially arranged in the second direction OB form a pixel unit, and a plurality of pixel units are arranged in an array in the first direction OA and the second direction OB.

In exemplary embodiments, the plurality of conductive patterns include a first conductive pattern, a second conductive pattern and a third conductive pattern.

In some embodiments, as shown in FIG. 15, the first conductive pattern is located on the first conductive layer (for example, SD1 layer), and a portion of the first conductive pattern located at a position of the first sub-pixel P1, a portion of the first conductive pattern located at a position of the second sub-pixel P2 and a portion of the first conductive pattern located at a position of the third sub-pixel P3 are not completely the same.

Here, the meaning of "not completely the same" is "partially the same" or "partially different". Specifically, "not completely the same" can be understood as the same main part and different local areas.

For example, the first sub-pixel P1 is a red sub-pixel, the second sub-pixel P2 is a green sub-pixel and the third sub-pixel P3 is a blue sub-pixel.

In at least one embodiment of the present disclosure, as shown in FIG. 15, the portion of the first conductive pattern located at the position of the third sub-pixel P3 includes a first shielding portion ZD1. As shown in FIG. 16, an orthographic projection of the first shielding portion ZD1 on the substrate at least partially overlaps with an orthographic projection of an active portion of the seventh transistor T7 in the third sub-pixel P3 on the substrate. The first shielding portion ZD1 is further used as a connection wiring connecting an anode of the third sub-pixel P3 and the source of the seventh transistor T7.

As shown in FIG. 15, the first conductive layer (for example, SD1 layer) further includes a first transfer electrode E1, a second transfer electrode E2, a third transfer electrode E3, a fourth transfer electrode E4 and a fifth transfer electrode E5. The pixel unit includes the first sub-pixel P1, the second sub-pixel P2 and the third sub-pixel P3.

For each sub-pixel, an area where the sub-pixel is located includes the first transfer electrode E1, the second transfer electrode E2, the fourth transfer electrode E4 and the fifth transfer electrode E5. As shown in FIG. 15 and FIG. 16, the first transfer electrode E1 is used to electrically connect the gate of the third transistor T3 to the first node N1, or to electrically connect the gate of the third transistor T3 to the source of the sixth transistor T6 and the source of the first transistor T1 respectively. As shown in FIG. 15, an area marked L7 in FIG. 16 and FIG. 17, the second transfer electrode E2 is used to electrically connect the source of the fourth transistor T4 to the data signal line DL. As shown in FIG. 16 and FIG. 7, one end of the fourth transfer electrode E4 is electrically connected to the drain of the first transistor T1, and the other end of the fourth transfer electrode E4 is electrically connected to the first electrode (a lower electrode located on the Gate1 layer) of the first capacitor C1. As shown in FIG. 16 and FIG. 8, the fifth transfer electrode E5 is used to electrically connect the drain of the fourth transistor T4 to the fifth node N5, or the fifth transfer electrode E5 is used to electrically connect the drain of the fourth transistor T4 to the second electrode (an upper electrode marked as c2s in the Gate2 layer) of the second capacitor C2.

Each first sub-pixel P1 and each second sub-pixel P2 both include the third transfer electrode E3, and each third sub-pixel P3 includes a first shielding portion ZD1. An area of a planar shape of the first shielding portion ZD1 is larger than an area of a planar shape of the third transfer electrode E3, and the first shielding portion ZD1 can be used to electrically connect the anode of the third sub-pixel P3 to the source of the seventh transistor T7. The third transfer electrode E3 can be used to electrically connect the anode of the first sub-pixel P1 (or the second sub-pixel P2) to the source of the seventh transistor T7.

In addition, as shown in FIG. 16, the source of the fifth transistor T5 and the positive power signal line (VDD line) are connected together at an area marked L1; the gate of the fifth transistor T5 and the first light emitting control signal line (EM1 line) are connected together at an area marked L2 and have an integrated structure; the drain of the fifth transistor T5 and the source of the third transistor T3 are connected together at an area marked L3; the first initialization signal line (Vinit1 line) and the drain of the second transistor are connected together at an area marked L4; the first reset signal line (Reset1 line) and the gate of the seventh transistor T7 are connected together at an area marked L5 and have an integrated structure.

In at least one embodiment of the present disclosure, as shown in FIG. 17, FIG. 18 and FIG. 19, the display substrate further includes a second conductive layer (for example, SD2 layer). The second conductive layer SD2 is located on a side of the first conductive layer SD1 away from the substrate, and a first insulating layer is arranged between the first conductive layer SD1 and the second conductive layer SD2.

The second conductive layer SD2 includes a plurality of data signal lines DL extending in the first direction OA. The second conductive pattern is located on the second conductive layer SD2. The second conductive pattern includes a plurality of second shielding portions ZD2 and a plurality of third shielding portions ZD3. One of the plurality of second shielding portions ZD2 and one of the plurality of third shielding portions ZD3 are arranged between two adjacent data signal lines DL, and orthographic projections of the plurality of second shielding portions ZD2 on the substrate do not overlap with orthographic projections of the plurality of third shielding portions ZD3 on the substrate.

In some embodiments, as shown in FIG. 17 and FIG. 18, the orthographic projections of the active portions of the first transistor T1, the second transistor T2, the fourth transistor T4 and the sixth transistor T6 on the substrate all at least partially overlap with the orthographic projections of the plurality of second shielding portions ZD2 on the substrate, and orthographic projections of active portions of the third transistor T3, the fifth transistor T5 and the seventh transistor T7 on the substrate all at least partially overlap with the orthographic projections of the plurality of third shielding portions ZD3 on the substrate.

In some embodiments, the first insulating layer can include at least one of a first passivation layer or a first planarization layer. The material of the passivation layer can be inorganic insulating materials, for example, silicon nitride, silicon oxide, silicon oxynitride, and the like. The material of the planarization layer can include organic insulating materials, for example, polyimide, epoxy resin, acrylic, polyester, photoresist, polyacrylate, polyamide, siloxane and other resin materials.

In some embodiments, the second shielding portion ZD2 and the third shielding portion ZD3 can both be independent island shaped conductive patterns that are not electrically connected to other signal lines or conductive structures.

In some embodiments, the second shielding portion ZD2 and the third shielding portion ZD3 can be electrically connected to the signal line respectively.

For the sake of clarity, FIG. 19 is a schematic plan view of a semiconductor layer, a sixth conductive layer and a second conductive layer as stacked (Active layer/Gate3 layer/SD2 layer) in a display substrate provided by an embodiment of the present disclosure. An area where the semiconductor layer overlaps with the sixth conductive layer is an area where the active portions of the transistors are located. It can be seen that for all sub-pixels, the orthographic projections of the active portions of the first transistor T1, the second transistor T2, the fourth transistor T4 and the sixth transistor T6 on the substrate are all located within the orthographic projection of the second shielding portion ZD2 on the substrate; the orthographic projections of the active portions of the third transistor T3 and the seventh transistor T7 on the substrate overlap with the orthographic projection of the third shielding portion ZD3 on the substrate, and the orthographic projection of the active portion of the fifth transistor T5 on the substrate is located within the orthographic projection of the third shielding portion ZD3 on the substrate.

In at least one embodiment of the present disclosure, as shown in FIG. 17 and FIG. 18, the plurality of second shielding portions ZD2 are electrically connected to the positive power signal line (VDD line) through via holes marked Via-VDD, and the plurality of third shielding portions ZD3 are electrically connected to at least one of the first initialization signal line (Vinit1 line), the second initialization signal line (Vinit2 line) or a negative power signal line (VSS line).

For example, a portion of the plurality of third shielding portions ZD3 located at the position of the first sub-pixel P1 can be electrically connected to the first initialization signal line (Vinit1 line) through via holes marked Via-Vinit1, a portion of the plurality of third shielding portions ZD3 located at the position of the second sub-pixel P2 can be electrically connected to the second initialization signal line (Vinit2 line) through via holes marked Via-Vinit2, a portion of the plurality of third shielding portions ZD3 located at the position of the third sub-pixel P3 is electrically connected to the negative power signal line (VSS line), and the negative power signal line (VSS line) is electrically connected to a cathode of the light emitting device.

It should be noted that both FIG. 17 and FIG. 18 show a via hole through which the portion of the third shielding portion ZD3 located at the position of the third sub-pixel P3 is electrically connected to the negative power signal line (VSS line). The via hole connected to the position of the third sub-pixel P3 and the negative power signal line can be arranged at a position near the peripheral area of the display area (for example, Dummy pixel area) or in the peripheral area. The Dummy pixel area can be a pixel area that does not actually display pictures or emit light. Specifically, the via hole connected to the position of the third sub-pixel P3 and the negative power signal line can be arranged in an area where a cathode ring is located. The related design of the cathode ring can refer to the introduction in the related art, which will not be repeated here.

In addition, in FIG. 17, a via hole marked Via-DL/T4 is used to electrically connect the data signal line DL to the fourth transistor T4, and the via holes marked Via-PLN1 and Via-PLN2 are used to connect the anode of the light emitting device 8 and the pixel driving circuit together. The marks Via-PLN1 and Via-PLN2 are explained by taking the insulating layer between the first conductive layer SD1 and the second conductive layer SD2 as a first planarization layer PLN1, and the insulating layer arranged on the side of the second conductive layer SD2 away from the first conductive layer SD1 as a second planarization layer PLN2.

As shown in FIG. 18, the plurality of second shielding portions ZD2 at the position where all sub-pixels are located are electrically connected to the positive power signal line (VDD line), the third shielding portion ZD3 at the position where the first sub-pixel P1 is located is electrically connected to the first initialization signal line (Vinit1 line), the third shielding portion ZD3 at the position where the second sub-pixel P2 is located is electrically connected to the second initialization signal line (Vinit2 line), and the third shielding portion ZD3 at the position where the third sub-pixel P3 is located is electrically connected to the negative power signal line (VSS line). The positions marked with rectangles in FIG. 18 are positions where connecting vias between the second shielding portions ZD2 with the positive power signal line (VDD line) are located, the position marked with ellipse is a position where a connecting via between the third shielding portion ZD3 and the first initialization signal line (Vinit1 line) is located, and the position marked with triangle is a position where the connecting via between the third shielding portion ZD3 and the second initialization signal line (Vinit2 line).

For the position where the sub-pixels in the same column are located, a plurality of second shielding portions ZD2 are connected together and have an integrated structure, and the extension trend of the plurality of second shielding portions ZD2 is consistent with the extension trend of the data signal line DL. A plurality of third shielding portions ZD3 are connected together and have an integrated structure, and the extension trend of the plurality of third shielding portions ZD3 is consistent with the extension trend of the data signal line DL.

In the embodiments of the present disclosure, by arranging all the second shielding portions ZD2 to be electrically connected to the positive power signal line (VDD line) through the via hole marked Via-VDD, the portion of the third shielding portion ZD3 located at the position of the first sub-pixel P1 can be electrically connected to the first initialization signal line (Vinit1 line) through the via hole marked Via-Vinit1; the portion of the third shielding portion ZD3 located at the position of the second sub-pixel P2 can be electrically connected to the second initialization signal line (Vinit2 line) through the via hole marked Via-Vinit2, and the portion of the third shielding portion ZD3 located at the position of the third sub-pixel P3 is electrically connected to the negative power signal line (VSS line), which is electrically connected to the cathode of the light emitting device. On the one hand, the shielding effect of the shielding portion on the active portion of the transistor can be improved, thereby avoiding the generation of photocarriers and improving the stability of the performance of the transistor; on the other hand, both the second shielding portion ZD2 and the third shielding portion ZD3 can be used as a part of the signal lines, so that the positive power signal line (VDD line), the first initialization signal line (Vinit1 line) and the negative power signal line (VSS line) are meshed, thereby reducing the voltage drop of the positive power signal line (VDD line), the first initialization signal line (Vinit1 line) and the negative power signal line (VSS line), improving the stability of the respective transmission signal lines, reducing the signal transmission loss and promoting the uniformity of the display screen.

In at least one embodiment of the present disclosure, as shown in FIG. 20, the display substrate further includes a third conductive layer (for example, AN layer). The third conductive layer AN is located on a side of the second conductive layer SD2 away from the substrate, a second insulating layer is arranged between the second conductive layer SD2 and the third conductive layer AN, and the third conductive layer AN includes anodes of light emitting devices 8 in all the sub-pixels.

In the same pixel unit, the anode AN-3 of the light emitting device in the third sub-pixel P3 covers at least the active portion of the second transistor T2 and the active portion of the third transistor T3 in the first sub-pixel P1, and further covers at least the active portion of the sixth transistor T6, the active portion of the first transistor T1, the active portion of the second transistor T2 and the active portion of the third transistor T3 in the second sub-pixel P2, and further covers at least a partial area of the active portion of the first transistor T1 and a partial area of the active portion of the sixth transistor T6 in the third sub-pixel P3; the anode AN-1 of the light emitting device in the first sub-pixel P1 covers at least the active portion of the seventh transistor T7 in the first sub-pixel P1, and the anode AN-2 of the light emitting device in the second sub-pixel P2 covers at least the active portion of the seventh transistor T7 in the second sub-pixel P2.

For example, as shown in FIG. 21, in the same pixel unit, the anode AN-3 of the light emitting device in the third sub-pixel P3 covers the second transistor T2 and the third transistor T3 in the first sub-pixel P1, and further covers the active portion of the sixth transistor T6, the first transistor T1, the second transistor T2 and the third transistor T3 in the second sub-pixel P2, and further covers a partial area of the first transistor T1 and a partial area of the sixth transistor T6 in the third sub-pixel P3. The anode AN-1 of the light emitting device in the first sub-pixel P1 covers the seventh transistor T7 in the first sub-pixel P1, and the anode AN-2 of the light emitting device in the second sub-pixel P2 covers the seventh transistor T7 in the second sub-pixel P2.

In at least one embodiment of the present disclosure, in the same pixel unit, a anode AN-3 of the light emitting device in the third sub-pixel P3 covers a local area of the sixth transistor T6 in the first sub-pixel P1, for example, covers a local area of the gate of the sixth transistor T6 in the first sub-pixel P1. The anode AN-3 of the light emitting device in the third sub-pixel P3 further covers the active portion of the sixth transistor T6 in the second sub-pixel P2, and one of the source and the drain of the sixth transistor T6. The anode AN-3 of the light emitting device in the third sub-pixel P3 further covers a partial area of the active portion of the first transistor T1 in the third sub-pixel P3, and one of the source and the drain of the sixth transistor T6.

In at least one embodiment of the present disclosure, in two adjacent pixel units arranged in the first direction, the anode AN-1 of the first sub-pixel P1 in one pixel unit further covers at least a partial area of the active portion of the fourth transistor T4 and the active portion of the fifth transistor T5 in the first sub-pixel P1 in the other pixel unit; and the anode AN-2 of the second sub-pixel P2 in one pixel unit further covers at least the active portion of the fifth transistor T5 in the second sub-pixel P2 in the other pixel unit, and a partial area of the active portion of the third sub-pixel P3 and a partial area of the active portion of the fourth transistor T4.

For example, as shown in FIG. 21, in two adjacent pixel units arranged in the first direction, the anode AN-1 of the first sub-pixel P1 in one pixel unit further covers at least partial area of the fourth transistor T4 and the fifth transistor T5 in the first sub-pixel P1 in the other pixel unit; and the anode AN-2 of the second sub-pixel P2 in one pixel unit covers the fifth transistor T5 in the second sub-pixel P2 in the other pixel unit and at least partial area of the fourth transistor T4 in the third sub-pixel P3.

It should be noted that "A covers at least B" means that A covers B; or, A covers B, and A further covers other areas except A.

In exemplary embodiments, for two adjacent pixel units arranged in a column direction, for example, a first pixel unit and a second pixel unit arranged in the column direction and arranged adjacent to each other, the anode AN-1 of the first sub-pixel P1 in the first pixel unit covers at least partial area of the fourth transistor T4 in the second pixel unit (for example, covering the active region of the fourth transistor and further covering one of the source and drain of the fourth transistor) and the fifth transistor t5. The anode AN-2 of the second sub-pixel P2 in the first pixel unit covers the fifth transistor T5 of the second sub-pixel in the second pixel unit, and the anode AN-2 of the second sub-pixel P2 in the first pixel unit covers at least partial area of the fourth transistor T4 in the third sub-pixel P3 in the second pixel unit (for example, covering the active region of the fourth transistor and further covering one of the source and drain of the fourth transistor).

In exemplary embodiments, the orthographic projection of the first shielding portion ZD1 located in the first conductive layer SD1 on the substrate overlaps with the orthographic projection of the anode AN-3 of the third sub-pixel P3 on the substrate.

In at least one embodiment of the present disclosure, as shown in FIG. 21, the third conductive pattern is located on the third conductive layer AN, and the third conductive pattern includes a plurality of fourth shielding portions ZD4. The plurality of fourth shielding portions ZD4 cover at least the active portion of the third transistor T3 in the third sub-pixel P3, and the plurality of fourth shielding portions ZD4 and the anode AN-3 of the light emitting device in the third sub-pixel P3 are of an integrated structure.

In at least one embodiment of the present disclosure, as shown in FIG. 21, the plurality of fourth shielding portions ZD4 cover the third transistor T3 in the third sub-pixel P3.

In the embodiments of the present disclosure, by arranging the positions of the first shielding portion ZD1, the second shielding portion ZD2, the third shielding portion ZD3, the fourth shielding portion ZD4 and the anode of each light emitting device, the active portions of all transistors in at least one sub-pixel can be shielded (upper sides and lower sides of the active portions of all transistors can be shielded), thereby avoiding the negative influence of light on the characteristics of the transistors, improving the electrical stability of the transistors, and improving the uniformity of image quality and brightness.

In some embodiments, by arranging the positions of the first shielding portion ZD1, the second shielding portion ZD2, the third shielding portion ZD3, the fourth shielding portion ZD4, the anode of each light emitting device and the signal line, the semiconductor layer (Active) in the display substrate can be shielded, thereby avoiding the negative influence of light on the characteristics of the transistors, further improving the electrical stability of the transistors and improving the uniformity of image quality and brightness.

In at least one embodiment of the present disclosure, as shown in FIG. 7 and FIG. 8, the display substrate further includes a fourth conductive layer (for example, Gate1 layer) and a fifth conductive layer (for example, Gate2 layer). The fourth conductive layer (for example, Gate1 layer) is located between the substrate and the fifth conductive layer (for example, Gate2 layer), and the fifth conductive layer (for example, Gate2 layer) is located between the first conductive layer (for example, SD1 layer) and the fourth conductive layer (for example, Gate1 layer).

In some embodiments, as shown in FIG. 7, the fourth conductive layer (for example, Gate1 layer) includes the first electrode of the first capacitor C1 and the first electrode of the second capacitor C2. The first electrode of the first capacitor C1 and the first electrode of the second capacitor C2 are of an integrated structure.

In some embodiments, the fourth conductive layer (for example, the Gate1 layer) can be used to shield the active portion of each transistor to prevent light from irradiating the active portion of the transistor through the substrate.

In some embodiments, as shown in FIG. 8 and FIG. 9, the fifth conductive layer (for example, Gate2 layer) includes a first light emitting control auxiliary line (EM1-$f$ line), a first reset auxiliary line (Reset1-$f$ line), the gate gt1 of the first transistor, the gate gt2 of the second transistor, the gate gt3 of the third transistor, the gate gt4 of the fourth transistor, the gate gt5 of the fifth transistor, the gate gt6 of the sixth transistor, the gate gt7 of the seventh transistor, the second electrode c1$s$ of the first capacitor and the second electrode c2$s$ of the second capacitor.

As shown in FIG. 8, the gate gt1 of the first transistor and the gate gt2 of the second transistor are of an integrated structure, the gate gt3 of the third transistor is shared with the second electrode c1$s$ of the first capacitor, the gate gt5 of the fifth transistor and the first light emitting control auxiliary line (EM1-$f$ line) are of an integrated structure, the gate gt7 of the seventh transistor and the first reset auxiliary line (Reset1-$f$ line) are of an integrated structure; the first light emitting control auxiliary line (EM1-$f$ line) is electrically connected to the first light emitting control signal line (EM1 line), and the first reset auxiliary line (Reset1-$f$ line) is electrically connected to the first reset signal line.

In some embodiments, all transistors of the display substrate are transistors with a bottom gate structure, that is, the gates of the transistors are located between the substrate and the semiconductor layer.

In some embodiments, at least a part of the transistors in the display substrate are transistors with a double-gate structure.

In at least one embodiment of the present disclosure, as shown in FIG. 10, the display substrate further includes a semiconductor layer (Active layer). The semiconductor layer (Active layer) is located on a side of the fifth conductive layer (Gate2 layer) away from the fourth conductive layer (Gate1 layer).

In an area where the sub-pixel is located, the semiconductor layer includes a first portion A1, a second portion A2, a third portion A3, a fourth portion A4, a fifth portion A5, a sixth portion A6 and a seventh portion A7.

In some embodiments, as shown in FIG. 10 and FIG. 11, the first portion A1 includes the source, the drain and the active portion of the first transistor T1, the second portion A2 includes the source, the drain and the active portion of the second transistor T2, the third portion A3 includes the source, the drain and the active portion of the third transistor T3, the fourth portion A4 includes the source, the drain and the active portion of the fourth transistor T4, the fifth portion A5 includes the source, the drain and the active portion of the fifth transistor T5, the sixth portion A6 includes the source, the drain and the active portion of the sixth transistor T6, and the seventh portion A7 includes the source, the drain and the active portion of the seventh transistor T7.

The fourth portion A4, the sixth portion A6 and the first portion A1 all extend in the first direction OA and are sequentially connected, the second portion A2 is located on a side of the first portion A1 close to the third portion A3 and the second portion A2 is connected to the first portion A1, and the fifth portion A5, the third portion A3 and the seventh portion A7 all extend in the first direction OA and are sequentially connected.

An area of the semiconductor layer overlapping with an orthographic projection of the gate (for example, gt1, gt2, gt3, gt4, gt5, gt6, gt7) of the transistor on the substrate is the active portion of the transistor, and an area of the semiconductor layer not overlapping with an orthographic projection of the transistor on the substrate is the source or the drain of the transistor.

In this specification, a transistor refers to an element including at least three terminals: a gate electrode (also called the gate), a drain electrode (also called the drain) and a source electrode (also called the source). The transistor has a channel region between the drain and the source (the channel region is located on the active portion), and the current can flow through the drain, the channel region and the source. Note that in this specification, channel regions (for example, GD-1, GD-2, GD-3, GD-4, GD-5, GD-6 and GD-7 shown in FIG. 18) refer to regions where the current mainly flows. When transistors with opposite polarities are used or a direction of the current changes during circuit operation, functions of "source" and "drain" are sometimes interchanged. Therefore, in this specification, "the source" and "the drain" can be interchanged.

The semiconductor layer can be patterned with semiconductor materials, which can be oxide semiconductor materials, for example, IGZO.

In exemplary embodiments, as shown in a structure in a dotted line circle in FIG. 10, in order to avoid the decrease of the dimensional accuracy at a corner of the first portion A1 and the second portion A2 in the semiconductor layer due to the diffraction of light in the actual preparation process, a concave structure as shown in the dotted line circle in FIG. 10 can be designed when designing a mask to improve the dimensional accuracy of the conductive pattern in the semiconductor layer, thereby making an actual aspect ratio of the transistor consistent with a designed aspect ratio and improving the electrical stability of the transistor.

In at least one embodiment of the present disclosure, as shown in FIG. 12, the display substrate further includes a sixth conductive layer (Gate3 layer). The sixth conductive layer (Gate3 layer) is located on a side of the semiconductor layer (Active layer) away from the fifth conductive layer (Gate2 layer).

The sixth conductive layer includes the first light emitting control signal line (EM1 line) and the first reset signal line (Reset1 line). An orthographic projection of the first light emitting control signal line (EM1 line) on the substrate overlaps with an orthographic projection of the first light emitting control auxiliary line (EM1-*f* line) on the substrate, and an orthographic projection of the first reset signal line (Reset1 line) on the substrate overlaps with an orthographic projection of the first reset auxiliary line (Reset1-*f* line) on the substrate.

In the area where the sub-pixel is located, as shown in FIG. 12, the sixth conductive layer (Gate3 layer) further includes a first conductive portion G3-1, a third conductive portion G3-3, a fourth conductive portion G3-4, a fifth conductive portion G3-5, a sixth conductive portion G3-6 and a seventh conductive portion G3-7. The fifth conductive portion G3-5 and the first light emitting control signal line (EM1 line) are of an integrated structure, and the seventh conductive portion G3-7 and the first reset signal line (Reset1 line) are of an integrated structure.

In some embodiments, as shown in FIG. 13, FIG. 14, FIG. 16 and FIG. 18, an orthographic projection of the first conductive portion G3-1 on the substrate at least partially overlaps with the orthographic projection of the active portion of the first transistor T1 on the substrate and the orthographic projection of the active portion of the second transistor T2 on the substrate respectively, an orthographic projection of the third conductive portion G3-3 on the substrate at least partially overlaps with the orthographic projection of the third transistor T3 on the substrate, an orthographic projection of the fourth conductive portion G3-4 on the substrate at least partially overlaps with the orthographic projection of the fourth transistor T4 on the substrate, an orthographic projection of the fifth conductive portion G3-5 on the substrate at least partially overlaps with the orthographic projection of the fifth transistor T5 on the substrate, an orthographic projection of the sixth conductive portion G3-6 on the substrate at least partially overlaps with the orthographic projection of the sixth transistor T6 on the substrate, and an orthographic projection of the seventh conductive portion G3-7 on the substrate at least partially overlaps with the orthographic projection of the seventh transistor T7 on the substrate.

In at least one embodiment of the present disclosure, the transistor is a transistor with a double-gate structure. As shown in FIG. 13, FIG. 14, FIG. 16 and FIG. 18, the first conductive portion G3-1 serves as another gate of the first transistor T1 and the second transistor T2, the third conductive portion G3-3 serves as another gate of the third transistor T3, the fourth conductive portion G3-4 serves as another gate of the fourth transistor T4, the fifth conductive portion G3-5 serves as another gate of the fifth transistor T5, the sixth conductive portion G3-6 serves as another gate of the sixth transistor T6 and the seventh conductive portion G3-7 serves as another gate of the seventh transistor T7.

In exemplary embodiments, the third transistor T3 is a driving transistor, and the other transistors are switching transistors. When each of the switching transistors has a double-gate structure, a bottom gate and a top gate of the switching transistor are electrically connected together; and when the driving transistor has a double-gate structure, a bottom gate of the driving transistor is electrically connected to a drain of the driving transistor through a connecting via, and a top gate of the driving transistor is electrically connected to a source of the first transistor T1, which is beneficial to improving the driving stability of the driving transistor T3.

In at least one embodiment of the present disclosure, a material of the semiconductor layer includes a metal oxide, for example, IGZO.

It should be noted that in a layout provided by the embodiments of the present disclosure, a specific location of the via hole for electrical connection between two conductive structures is not defined, and an actual location of the via hole can be arranged according to space and electrical connection requirements.

The embodiments of the present disclosure provide a display panel including the display substrate as described above.

In the display panel provided by the embodiments of the present disclosure, by arranging the orthographic projections of the active portions of all transistors in at least one sub-pixel on the substrate to be within the orthographic projections of the plurality of conductive patterns on the substrate, the influence of illumination on the active portions can be avoided, and the generation of photocarriers can be avoided, and thus the problem of TFT characteristic drift caused by illumination of the active portions of the transistors can be well avoided, thereby improving the image quality of the product, and improving the yield.

The present disclosure further provides a display device. The display device can include the display substrate as described above. The display device can include any apparatus or product with a display function. For example, the display device can be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (for example, a head-mounted device, electronic clothing, electronic bracelet, electronic necklace, electronic accessory, electronic tattoo or smart watch), a television, and the like.

The above is only the specific implementation of the present disclosure, but the protection scope of the present disclosure is not limited to this. Any skilled person familiar with this technical field can easily think of changes or replacements within the technical scope disclosed in the present disclosure, which should be covered within the protection scope of the present disclosure. Therefore, the protection scope of the present disclosure should be based on the protection scope of the claims.

The invention claimed is:

1. A display substrate, comprising: a substrate and a plurality of sub-pixels arranged in an array on the substrate, wherein each of the plurality of sub-pixels comprises a pixel driving circuit and a light emitting device that are electrically connected, and the pixel driving circuit comprises:

a driving module electrically connected to a first node, a second node and a third node respectively, wherein the third node is electrically connected to an anode of the light emitting device, and the driving module is configured to conduct a path between the second node and the anode under a control of a voltage of the first node, and generate a current in the path for driving the light emitting device to emit light;

a first reset module and a second reset module, wherein the first reset module is electrically connected to the third node, a first reset signal line and a second initialization signal line respectively, and is configured to initialize a voltage of the anode under a control of a signal transmitted by the first reset signal line; and the second reset module is electrically connected to the first node, a fourth node, a second reset signal line and a first initialization signal line respectively, and is configured to initialize a voltage of the first node and a voltage of the fourth node under a control of a signal transmitted by the second reset signal line;

an input module electrically connected to a scanning signal line, a data signal line and a fifth node respectively, and configured to input a data signal transmitted by the data signal line to the fifth node under a control of a signal input by the scanning signal line;

a first light emitting control module and a second light emitting control module, wherein the first light emitting control module is electrically connected to a first light emitting control signal line, a positive power signal line and the second node respectively, and is configured to input a signal transmitted by the positive power signal line to the second node under a control of a signal transmitted by the first light emitting control signal line; and the second light emitting control module is electrically connected to the first node, the fifth node and a second light emitting control signal line respectively, and is configured to transmit a signal of the fifth node to the first node under a control of a signal transmitted by the second light emitting control signal line; and a compensation module electrically connected to the third node, the fourth node and the fifth node respectively, and configured to compensate a threshold voltage of the driving module, wherein the pixel driving circuit comprises a plurality of transistors, and each of the plurality of transistors comprises an active portion; the display substrate further comprises a plurality of conductive patterns, a part of the plurality of conductive patterns are located on a side of the active portion of the transistor away from the substrate, and a part of the plurality of conductive patterns are located between the active portion of the transistor and the substrate, wherein orthographic projections of active portions of the plurality of transistors in at least one of the plurality of sub-pixels on the substrate are located within orthographic projections of the plurality of conductive patterns on the substrate, wherein the second reset module comprises a first transistor and a second transistor, the driving module comprises a third transistor, the input module comprises a fourth transistor, the first light emitting control module comprises a fifth transistor, the second light emitting control module comprises a sixth transistor, the first reset module comprises a seventh transistor, and the compensation module comprises a first capacitor and a second capacitor, wherein a gate of the first transistor and a gate of the second transistor are both electrically connected to the second reset signal line, a source of the first transistor is electrically connected to the first node, a drain of the first transistor is electrically connected to the fourth node, a source of the second transistor is electrically connected to the fourth node, and a drain of the second transistor is electrically connected to the first initialization signal line, wherein a gate of the third transistor is electrically connected to the first node, a source of the third transistor is electrically connected to a drain of the fifth transistor through the second node, and a drain of the third transistor is electrically connected to the anode through the third node, wherein a gate of the fourth transistor is electrically connected to the scanning signal line, a source of the fourth transistor is electrically connected to the data signal line, and a drain of the fourth transistor is electrically connected to the fifth node, wherein a gate of the fifth transistor is electrically connected to the first light emitting control signal line, a source of the fifth transistor is electrically connected to the positive power signal line, a gate of the sixth transistor is electrically connected to the second light emitting control signal line, a source of the sixth transistor is electrically connected to the first node, and a drain of the sixth transistor is electrically connected to the fifth node, wherein a gate of the seventh transistor is electrically connected to the first reset signal line, a source of the seventh transistor is electrically connected to the third node, and a drain of the seventh transistor is electrically connected to the second initialization signal line, wherein a first electrode of the first capacitor is electrically connected to a first electrode of the second capacitor, a second electrode of the first capacitor is electrically connected to the third node, and a second electrode of the second capacitor is electrically connected to the fifth node, wherein the display substrate comprises a first conductive layer, wherein the first conductive layer is located on the side of the active portion of the transistor away from the substrate, wherein the first conductive layer comprises the positive power signal line, the scanning signal line, the second light emitting control signal line, the first initialization signal line, the second reset signal line and the second initialization signal line that are sequentially arranged in a first direction and extend in a second direction, and wherein an orthographic projection of the scanning signal line on the substrate at least partially overlaps with an orthographic projection of an active portion of the fourth transistor in a same row of sub-pixels arranged in the second direction on the substrate; an orthographic projection of the second light emitting control signal line on the substrate at least partially overlaps with an orthographic projection of an active portion of the sixth transistor in the same row of sub-pixels arranged in the second direction on the substrate; an orthographic projection of the second reset signal line on the substrate at least partially overlaps with an orthographic projection of an active portion of the first transistor in the same row of sub-pixels arranged in the second direction on the substrate, and the orthographic projection of the second reset signal line on the substrate at least partially overlaps with an orthographic projection of an active portion of the second transistor in the same row of sub-pixels arranged in the second direction on the substrate, wherein the first direction intersects with the second direction.

2. The display substrate according to claim 1, wherein the plurality of conductive patterns comprise a combination of one or more of the anode of the light emitting device, a signal line, a connection wiring, and a gate of the transistor.

3. The display substrate according to claim 1, wherein one of the plurality of sub-pixels is located at an area defined by two adjacent data lines and two adjacent positive power signal lines, and the plurality of sub-pixels comprise a plurality of first sub-pixels, a plurality of second sub-pixels and a plurality of third sub-pixels that are sequentially arranged in the second direction, and one of the plurality of first sub-pixels, one of the plurality of second sub-pixels and one of the plurality of third sub-pixels that are sequentially arranged in the second direction form a pixel unit, and a plurality of pixel units are arranged in an array in the first direction and the second direction; and the plurality of conductive patterns comprise a first conductive pattern, a second conductive pattern and a third conductive pattern, wherein the first conductive pattern is located on the first conductive layer, and a portion of the first conductive pattern located at a position of the first sub-pixel, a portion of the first conductive pattern located at a position of the second sub-pixel and a portion of the first conductive pattern located at a position of the third sub-pixel are not completely the same.

4. The display substrate according to claim 3, wherein the portion of the first conductive pattern located at the position of the third sub-pixel comprises a first shielding portion, wherein an orthographic projection of the first shielding portion on the substrate at least partially overlaps with an orthographic projection of an active portion of the seventh transistor in the third sub-pixel on the substrate, and the first shielding portion is further used as a connection wiring connecting an anode of the third sub-pixel and the source of the seventh transistor.

5. The display substrate according to claim 3, wherein the display substrate further comprises a second conductive layer, wherein the second conductive layer is located on a side of the first conductive layer away from the substrate, and a first insulating layer is arranged between the first conductive layer and the second conductive layer; and the second conductive layer comprises a plurality of data signal lines extending in the first direction, the second conductive pattern is located on the second conductive layer, the second conductive pattern comprises a plurality of second shielding portions and a plurality of third shielding portions, one of the plurality of second shielding portions and one of the plurality of third shielding portions are arranged between two adjacent data signal lines, and orthographic projections of the plurality of second shielding portions on the substrate do not overlap with orthographic projections of the plurality of third shielding portions on the substrate, wherein the orthographic projections of the active portions of the first transistor, the second transistor, the fourth transistor and the sixth transistor on the substrate all at least partially overlap with the orthographic projections of the plurality of second shielding portions on the substrate, and orthographic projections of active portions of the third transistor, the fifth transistor and the seventh transistor on the substrate all at least partially overlap with the orthographic projections of the plurality of third shielding portions on the substrate.

6. The display substrate according to claim 5, wherein the plurality of second shielding portions are electrically connected to the positive power signal line, and the plurality of third shielding portions are electrically connected to at least one of the first initialization signal line, the second initialization signal line or a negative power signal line.

7. The display substrate according to claim 6, wherein a portion of the plurality of third shielding portions located at the position of the first sub-pixel is electrically connected to the first initialization signal line, a portion of the plurality of third shielding portions located at the position of the second sub-pixel is electrically connected to the second initialization signal line, a portion of the plurality of third shielding portions located at the position of the third sub-pixel is electrically connected to the negative power signal line, and the negative power signal line is electrically connected to a cathode of the light emitting device.

8. The display substrate according to claim 5, wherein the display substrate further comprises a third conductive layer, wherein the third conductive layer is located on a side of the second conductive layer away from the substrate, a second insulating layer is arranged between the second conductive layer and the third conductive layer, and the third conductive layer comprises anodes of light emitting devices in all the sub-pixels, wherein in the same pixel unit, the anode of the light emitting device in the third sub-pixel covers at least the active portion of the second transistor and the active portion of the third transistor in the first sub-pixel, and further covers at least the active portion of the sixth transistor, the active portion of the first transistor, the active portion of the second transistor and the active portion of the third transistor in the second sub-pixel, and further covers at least a partial area of the active portion of the first transistor and a partial area of the active portion of the sixth transistor in the third sub-pixel; the anode of the light emitting device in the first sub-pixel covers at least the active portion of the seventh transistor in the first sub-pixel, and the anode of the light emitting device in the second sub-pixel covers at least the active portion of the seventh transistor in the second sub-pixel.

9. The display substrate according to claim 8, wherein in two adjacent pixel units arranged in the first direction, the anode of the first sub-pixel in one pixel unit further covers at least a partial area of the active portion of the fourth transistor and the active portion of the fifth transistor in the first sub-pixel in the other pixel unit; and the anode of the second sub-pixel in one pixel unit further covers at least the active portion of the fifth transistor in the second sub-pixel in the other pixel unit, and a partial area of the active portion of the third sub-pixel and a partial area of the active portion of the fourth transistor.

10. The display substrate according to claim 8, wherein the third conductive pattern is located on the third conductive layer, and the third conductive pattern comprises a plurality of fourth shielding portions, wherein the plurality of fourth shielding portions cover at least the active portion of the third transistor in the third sub-pixel, and the plurality of fourth shielding portions and the anode of the light emitting device in the third sub-pixel are of an integrated structure.

11. The display substrate according to claim 1, wherein the display substrate further comprises a fourth conductive layer and a fifth conductive layer, wherein the fourth conductive layer is located between the substrate and the fifth conductive layer, and the fifth conductive layer is located between the first conductive layer and the fourth conductive layer;

the fourth conductive layer comprises the first electrode of the first capacitor and the first electrode of the second capacitor, and the first electrode of the first capacitor and the first electrode of the second capacitor are of an integrated structure; and the fifth conductive layer comprises a first light emitting control auxiliary line, a first reset auxiliary line, the gate of the first transistor, the gate of the second transistor, the gate of the third transistor, the gate of the fourth transistor, the gate of the fifth transistor, the gate of the sixth transistor, the gate of the seventh transistor, the second electrode of the first capacitor and the second electrode of the second capacitor, wherein the gate of the first transistor and the gate of the second transistor are of an integrated structure, the gate of the third transistor is shared with the second electrode of the first capacitor, the gate of the fifth transistor and the first light emitting control auxiliary line are of an integrated structure, the gate of the seventh transistor and the first reset auxiliary line are of an integrated structure; the first light emitting control auxiliary line is electrically connected to the first light emitting control signal line, and the first reset auxiliary line is electrically connected to the first reset signal line.

12. The display substrate according to claim 11, wherein the display substrate further comprises a semiconductor layer, wherein the semiconductor layer is located on a side of the fifth conductive layer away from the fourth conductive layer;

in an area where the sub-pixel is located, the semiconductor layer comprises a first portion, a second portion, a third portion, a fourth portion, a fifth portion, a sixth portion and a seventh portion, wherein the first portion comprises the source, the drain and the active portion of the first transistor, the second portion comprises the source, the drain and the active portion of the second transistor, the third portion comprises the source, the drain and the active portion of the third transistor, the fourth portion comprises the source, the drain and the active portion of the fourth transistor, and the fifth portion comprises the source, the drain and the active portion of the fifth transistor, the sixth portion comprises the source, the drain and the active portion of the sixth transistor, and the seventh portion comprises the source, the drain and the active portion of the seventh transistor, wherein the fourth portion, the sixth portion and the first portion all extend in the first direction and are sequentially connected, the second portion is located on a side of the first portion close to the third portion and is connected to the first portion, and the fifth portion, the third portion and the seventh portion all extend in the first direction and are sequentially connected; and an area of the semiconductor layer overlapping with an orthographic projection of the gate of the transistor on the substrate is the active portion of the transistor, and an area of the semiconductor layer not overlapping with an orthographic projection of the transistor on the substrate is the source or the drain of the transistor.

13. The display substrate according to claim 12, wherein the display substrate further comprises a sixth conductive layer, wherein the sixth conductive layer is located on a side of the semiconductor layer away from the fifth conductive layer;

the sixth conductive layer comprises the first light emitting control signal line and the first reset signal line, wherein an orthographic projection of the first light emitting control signal line on the substrate overlaps with an orthographic projection of the first light emitting control auxiliary line on the substrate, and an orthographic projection of the first reset signal line on the substrate overlaps with an orthographic projection of the first reset auxiliary line on the substrate;

in the area where the sub-pixel is located, the sixth conductive layer further comprises a first conductive portion, a third conductive portion, a fourth conductive portion, a fifth conductive portion, a sixth conductive portion and a seventh conductive portion, wherein the fifth conductive portion and the first light emitting control signal line are of an integrated structure, and the seventh conductive portion and the first reset signal line are of an integrated structure; and an orthographic projection of the first conductive portion on the substrate at least partially overlaps with the orthographic projection of the active portion of the first transistor on the substrate and the orthographic projection of the active portion of the second transistor on the substrate respectively, an orthographic projection of the third conductive portion on the substrate at least partially overlaps with the orthographic projection of the third transistor on the substrate, an orthographic projection of the fourth conductive portion on the substrate at least partially overlaps with the orthographic projection of the fourth transistor on the substrate, an orthographic projection of the fifth conductive portion on the substrate at least partially overlaps with the orthographic projection of the fifth transistor on the substrate, an orthographic projection of the sixth conductive portion on the substrate at least partially overlaps with the orthographic projection of the sixth transistor on the substrate, and an orthographic projection of the seventh conductive portion on the substrate at least partially overlaps with the orthographic projection of the seventh transistor on the substrate.

14. The display substrate according to claim 13, wherein the transistor is a transistor with a double-gate structure, and the first conductive portion serves as another gate of the first transistor and the second transistor, the third conductive portion serves as another gate of the third transistor, the fourth conductive portion serves as another gate of the fourth transistor, the fifth conductive portion serves as another gate of the fifth transistor, the sixth conductive portion serves as another gate of the sixth transistor and the seventh conductive portion serves as another gate of the seventh transistor.

15. The display substrate according to claim 12, wherein a material of the semiconductor layer comprises a metal oxide.

16. A display panel, comprising the display substrate according to claim 1.

* * * * *